US006992018B2

(12) United States Patent
Watkins et al.

(10) Patent No.: US 6,992,018 B2
(45) Date of Patent: *Jan. 31, 2006

(54) CHEMICAL FLUID DEPOSITION FOR THE FORMATION OF METAL AND METAL ALLOY FILMS ON PATTERNED AND UNPATTERNED SUBSTRATES

(75) Inventors: James J. Watkins, South Hadley, MA (US); Jason M. Blackburn, Amherst, MA (US); David P. Long, Alexandria, VA (US); Jason L. Lazorcik, Northampton, MA (US)

(73) Assignee: University of Massachusetts, Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/745,843

(22) Filed: Dec. 24, 2003

(65) Prior Publication Data
US 2004/0229023 A1 Nov. 18, 2004

Related U.S. Application Data

(63) Continuation of application No. 09/704,935, filed on Nov. 2, 2000, now Pat. No. 6,689,700.

(60) Provisional application No. 60/223,839, filed on Aug. 8, 2000, provisional application No. 60/163,163, filed on Nov. 2, 1999.

(51) Int. Cl.
*H01L 1/31* (2006.01)
*H01L 1/469* (2006.01)
(52) U.S. Cl. ..................................... 438/762
(58) Field of Classification Search ........... 438/762, 438/767, 771, 784, 787–789, 792–793
See application file for complete search history.

(56) References Cited

U.S. PATENT DOCUMENTS
3,699,408 A * 10/1972 Shinoda et al. ............. 257/473
(Continued)

FOREIGN PATENT DOCUMENTS
EP    0881673 A2 *  2/1998
(Continued)

OTHER PUBLICATIONS
International Search Report; International Application No.: PCT/US 00/30264; Applicant: University of Massachusetts et al.
(Continued)

*Primary Examiner*—Craig A. Thompson
(74) *Attorney, Agent, or Firm*—Fish & Richardson P.C.

(57) ABSTRACT

Methods are described for depositing a film or discontinuous layer of discrete clusters, of material (e.g., metals, metal mixtures or alloys, metal oxides, or semiconductors) on the surface of a substrate, e.g., a patterned silicon wafer, by i) dissolving a precursor of the material into a supercritical or near-supercritical solvent to form a supercritical or near-supercritical solution; ii) exposing the substrate to the solution, under conditions at which the precursor is stable in the solution; and iii) mixing a reaction reagent into the solution under conditions that initiate a chemical reaction involving the precursor, thereby depositing the material onto the solid substrate, while maintaining supercritical or near-supercritical conditions. The invention also includes similar methods for depositing material particles into porous solids, and films of materials on substrates or porous solids having material particles deposited in them. The invention also covers methods of preparing a plated substrate by depositing a catalytic layer followed by a plating layer.

44 Claims, 11 Drawing Sheets

U.S. PATENT DOCUMENTS

| | | | |
|---|---|---|---|
| 4,552,786 | A | 11/1985 | Berneburg et al. |
| 4,582,731 | A | 4/1986 | Smith |
| 4,734,227 | A | 3/1988 | Smith |
| 4,737,384 | A | 4/1988 | Murthy et al. |
| 4,970,093 | A | 11/1990 | Sievers et al. |
| 5,403,621 | A | 4/1995 | Jackson et al. |
| 5,789,027 | A | 8/1998 | Watkins et al. |

FOREIGN PATENT DOCUMENTS

| | | |
|---|---|---|
| EP | 0 881 673 A2 | 12/1998 |
| GB | 0 881 673 A2 | 12/1998 |

OTHER PUBLICATIONS

B.M Hybertson et al., "Deposition of Palladium Films by a Novel supercritical Fluid Transport Chemical Deposition Process", Mat. Res. Bull., Vo. 26, pp. 1127-1133, 1991.

B. Hansen et al., "Supercritical Fluid Transport-Chemical Deposition of Films", Chem. Mater., vol. 4, 749-752, 1992.

J.F. Bocquet et al., A New $TiO_2$ Film Deposition Process in a Supercritical Fluid, Surface and Coatings Technology, 70 p. 73-78, 1994.

M.J. Hampden-Smith et al., "Chemical Vapor Deposition of Metals: Part 1. An Overview of CVD Processes", Chem. Vap. Deposition vol. 1, 8-23, 1995.

O.A. Louchev et al., "The Morphological Stability in Supercritical Fluid Chemical Deposition of Films Near the Critical Point", Journal of Crystal Growth 155, p. 276-285, 1995.

J.J. Watkins et al., "Polymer/Metal Nanocomposite Synthesis in Supercritical $CO_2$", Chemistry of Materials, vol. 7, No. 11, 1995.

* cited by examiner

CHEMICAL FLUID DEPOSITION FOR THE FORMATION OF METAL AND METAL ALLOY FILMS ON PATTERNED AND UNPATTERNED SUBSTRATES

CROSS-REFERENCE TO RELATED APPLICATIONS

This application is a continuation application of U.S. patent application Ser. No. 09/704,935, filed on Nov. 2, 2000, now U.S. Pat. No. 6,689,700 which claims benefit of priority from U.S. Provisional Patent Application Ser. No. 60/163,163, filed on Nov. 2, 1999, and from U.S. Provisional Patent Application No. 60/223,839, filed on Aug. 8, 2000, all of which are incorporated herein by reference in their entirety.

FIELD OF THE INVENTION

The invention relates to methods for depositing materials onto substrate surfaces or into porous solids.

BACKGROUND OF THE INVENTION

Thin films of materials such as metals, semiconductors, or metal oxide insulators are of great importance in the microelectronics industry. Fabrication of integrated circuits involves formation of high purity thin films, often with multiple layers, on patterned substrates. One of the most common methods for producing thin films is chemical vapor deposition (CVD). In thermal CVD, volatile precursors are vaporized under reduced pressure at temperatures below their thermal decomposition temperature and transported by means of a carrier gas into an evacuated chamber containing a substrate. The substrate is heated to high temperatures, and thermolysis at or adjacent to the heated substrate results in the surface deposition of the desired film. For a general reference on CVD see: Hitchman et al., eds., *Chemical Vapor Deposition Principles and Applications* (Academic Press, London, 1993).

Thin films have also been formed using supercritical fluids. For example, Murthy et al. (U.S. Pat. No. 4,737,384) describes a physical deposition method in which a metal or polymer is dissolved in a solvent under supercritical conditions and as the system is brought to sub-critical conditions the metal or polymer precipitates onto an exposed substrate as a thin film. Sievers et al. (U.S. Pat. No. 4,970,093) describes a standard CVD method in which organometallic CVD precursors are delivered to a conventional CVD reactor by dissolving the precursors in a supercritical fluid solvent. The solvent is expanded to produce a fine precursor aerosol which is injected into the CVD reactor under standard CVD conditions, i.e., pressures less than or equal to 1 atmosphere, to deposit a thin film on a substrate.

Louchev et al. (*J. Crystal Growth*, 155:276–285, 1995) describes the transport of a precursor to a heated substrate (700 K) in a supercritical fluid where it undergoes thermolysis to yield a thin metal (copper) film. Though the process takes place under high pressure, the temperature in the vicinity of the substrate is high enough that the density of the supercritical fluid approaches the density of a conventional gas. The film produced by this method had an atomic copper concentration of approximately 80% (i.e., 20% impurities). Bouquet et al. (*Surf and Coat. Tech.*, 70:73–78, 1994) describes a method in which a metal oxide is deposited from a supercritical mixture of liquid and gas co-solvents at a temperature of at least 240° C. The thin film forms as a result of thermolysis at a substrate heated to at least 290° C.

The formation of alloys from multiple pure metal components and films containing multiple pure metal components is also of interest in microelectronic applications and device fabrication for the formation of films exhibiting, e.g., gigantic magneto resistance (GMR), increased resistance to electromigration and for modification of electrical conductivity, and for the formation of other functional layers in integrated circuits. Alloying is also used to tailor rate and selectivity for reactions over supported catalysts, improve the resistance of metal membranes to hydrogen embrittlement and to increase the hardness and corrosion resistance of barrier coatings. Mixed metal films are typically produced by physical deposition methods such as ion sputtering, which is a line-of-sight technique. In principle, CVD can also be used to produce alloy films using a combination of metal precursors. Such deposition, however, would be limited by the relative volatilities of the precursors making precise control of multi-component feed streams across the composition range difficult to achieve. Moreover, attainment of a desired composition would also depend on the relative rates of decomposition.

Thin films of palladium (Pd) and its alloys are used in technologically important applications such as catalysis, gas sensors, and $H_2$ permselective membranes for use in gas separation and in integrated reaction/separation schemes. Moreover, Pd is a common noble metal in microelectronics, where it is used as a contact material in integrated circuits and as a seed layer for the electroless deposition of other interconnect metals. Pd films can be prepared by vacuum sputtering and electroplating. However, such techniques are generally limited to planar surfaces, limiting their applicability to applications in microelectronics where shrinking device dimensions require efficient filling of deep sub-micron, high-aspect ratio features.

High purity Pd thin films can be deposited by CVD using organopalladium compounds containing various classes of ancillary ligands as precursors. However, to maintain acceptable purity and deposition rates, temperatures usually exceed 200° C. Moreover, because CVD is often mass-transport limited, the deposited films are expected to be non-uniform, thereby limiting efficient pore-filling and/or conformal coverage of complex surfaces. Consequently, palladium CVD has not yet been commercialized.

Copper is also used in technologically important applications, including interconnect structures in microelectronic devices. Current methods of depositing copper, such as CVD and sputtering, have not been shown to provide uniform filling of very narrow (~150 nm and less), high aspect ratio trenches or vias. As a result, copper CVD has not been practiced commercially for these applications. Other applications for copper include printed wiring boards.

SUMMARY OF THE INVENTION

The invention features new methods for depositing a material, e.g., a thin film of a pure metal, a mixed metal, or a metal alloy, or a layer, e.g., a discontinuous layer of discrete uniformly distributed clusters, onto a substrate surface or into a porous solid substrate. The methods are generally referred to herein as chemical fluid deposition (CFD). CFD involves dissolving a precursor of the material to be deposited into a solvent under supercritical or near-supercritical conditions and exposing the substrate (or porous solid) to the solution. A reaction reagent is then mixed into the solution and the reaction reagent initiates a chemical reaction involving the precursor, thereby depositing the material onto the substrate surface (or within the porous solid). Use of a supercritical solvent in conjunction with a reaction reagent produces high purity thin films, e.g., metal or metal alloy films, or layers of discrete high purity metal or metal alloy clusters, at temperatures that can be lower than conventional CVD temperatures. The substrate surface can include one or more layers, which may be patterned. When patterned substrates are used, e.g., having deep sub-micron, high-aspect ratio features such as trenches, CFD can provide uniform conformal coverage and uniform filling of the features.

The invention also features a two-step process that involves (1) the deposition of a catalytic seed layer, e.g., of palladium, platinum, or copper, by CFD, followed by (2) plating, e.g., electroless or electrolytic plating, or additional CFD, of more of the same metal or another metal or alloy. The seed layer need not be continuous, i.e., the seed layer can be made of clusters of deposited material, but the isolated catalytic seed clusters should be distributed uniformly in any patterns, e.g., trenches or invaginations, in the surface of the substrate. The surface can be functionalized prior to deposition using coupling agents, e.g., chlorotrimethoxysilane, or example, to control the concentration and location of the seed layer deposit.

In another two-step process, a seed layer and thin film is created simultaneously by a first thermal disproportionation step using a precursor such as copper (e.g., Cu(I)), followed by the addition of a reaction reagent such as $H_2$ to reduce the products of the disproportionation reaction in a CFD method to obtain high yield deposition of the precursor onto a substrate.

In general, in one aspect, the invention features a method for depositing a film of a material, e.g., a metal, mixture of metals, metal alloy, metal oxide, metal sulfide, insulator, or semiconductor, onto the surface of a substrate, e.g., a silicon wafer, by i) dissolving a precursor of the material into a solvent, e.g., carbon dioxide, under supercritical or near-supercritical conditions to form a supercritical or near-supercritical solution; ii) exposing the substrate to the solution under conditions at which the precursor is stable in the solution; and iii) mixing a reaction reagent, e.g., hydrogen, into solution under conditions that initiate a chemical reaction involving the precursor, e.g., a reduction, oxidation, or hydrolysis reaction, thereby depositing the material onto the surface of the substrate, while maintaining supercritical or near-supercritical conditions.

For example, the method can be conducted so that the temperature of the substrate is maintained at no more than 200, 225, 250; 275, or 300° C., the solvent has a reduced temperature between 0.8 and 2.0, e.g., 1.0, 1.2, 1.4, 1.6, or 1.8, the solvent has a density of at least 0.1 g/cm$^3$, e.g., 0.125, 0.15. 0.175, or 0.2 g/cm$^3$, the solvent has a density of at least one third of its critical density, or so that the solvent has a critical temperature of less than 150° C. In addition, the method can be carried out so that the temperature of the substrate measured in Kelvin is less than twice the critical temperature of the solvent measured in Kelvin, or so that the temperature of the substrate measured in Kelvin divided by the average temperature of the supercritical solution measured in Kelvin is between 0.8 and 1.7. The method can also be conducted such that the average temperature of the supercritical solution is different from the temperature of the substrate.

In some embodiments, the material comprises multiple metals and the precursor comprises multiple precursors for the multiple metals. Furthermore, the material can be a homogeneous or inhomogeneous mixture of multiple metals, for example, the material can be a platinum/nickel mixture or alloy, or a copper mixture or alloy. Moreover, gradients of varying concentrations of individual metals may be created throughout a thin film.

The substrate can be a patterned substrate, such as one used in the microelectronics industry. The patterned substrate can have submicron features, which may have an aspect ratio greater than about 2, greater than about 3, or greater than about 10. The material can be deposited to conformally cover the features. In one embodiment, the substrate is a patterned silicon wafer and the material is palladium or a palladium alloy that conformally covers the patterned features. In another embodiment, the substrate is a patterned silicon wafer and the material is copper or a copper alloy that conformally covers or fills the patterned features.

In another aspect, the invention features an integrated circuit including a patterned substrate having submicron features and a film including palladium or copper conformally covering the features. The aspect ratio of the patterned features can be greater than about 2, greater than about 3, or greater than about 10.

The invention also features a method for depositing material within a microporous or nanoporous solid substrate by dissolving a precursor of the material into a solvent under supercritical or near-supercritical conditions to form a supercritical or near-supercritical solution; ii) exposing the solid substrate to the solution under conditions at which the precursor is stable in the solution; and iii) mixing a reaction reagent into the solution under conditions that initiate a chemical reaction involving the precursor, thereby depositing the material within the solid substrate, while maintaining supercritical or near-supercritical conditions. For example, this method can be conducted such that the temperature of the solid substrate is maintained at no more than 300, 275, 250, 225, 210, 200, or 190° C.

In another aspect, the invention features a film of a material, e.g., a metal, metal mixture, metal alloy, or semiconductor, on a substrate, the coated substrate itself, and microporous or nanoporous solid substrates having such materials deposited on and within them. One embodiment is a metal or metal alloy membrane formed within a porous solid substrate. These new substrates may or may not be prepared by the new methods. In a further aspect, the invention features an integrated circuit including the new substrates, which may be prepared by the new method.

In other embodiments, the invention features a method of depositing a seed layer of a material onto a substrate by i) dissolving a precursor of the material into a solvent to form a supercritical or near-supercritical solution; ii) exposing the substrate to the solution under conditions at which the precursor is stable in the solution; and iii) mixing a reaction reagent into the solution under conditions that initiate a chemical reaction involving the precursor, wherein the material is deposited as a seed layer onto the surface of the substrate when the substrate and the reaction reagent are in contact with the solution, while maintaining supercritical or near-supercritical conditions. The method can further include a step of depositing a metal film on the seed layer, e.g., by CFD.

The invention also includes a method of depositing a material onto a substrate by i) depositing a seed layer onto the substrate; ii) dissolving a precursor of the material into a solvent to form a supercritical or near-supercritical solution; iii) exposing the substrate and seed layer to the solution under conditions at which the precursor is stable in the solution; and iv) mixing a reaction reagent into the solution under conditions that initiate a chemical reaction involving the precursor, wherein the material is deposited onto the seed layer on the surface of the substrate when the substrate and the reaction reagent are in contact with the solution, while maintaining supercritical or near-supercritical conditions.

A variation includes a method of depositing a material onto a substrate by i) dissolving a precursor of the material into a solvent to form a supercritical or near-supercritical solution; ii) depositing a seed layer from the precursor by reduction of the precursor; and iii) mixing a reaction reagent into the solution under conditions that initiate a chemical reaction involving the precursor or reduction or decomposition products of the precursor, wherein the material is deposited onto the seed layer on the surface of the substrate when the substrate and the reaction reagent are in contact with the solution, while maintaining supercritical or near-supercritical conditions.

In another embodiment, the invention features a method of depositing a material onto a substrate by i) dissolving a precursor of the material into a solvent to form a supercritical or near-supercritical solution; and ii) depositing the material by simultaneous thermal reduction (e.g., disproportionation or thermolysis) and reaction with a reaction reagent in the solution under conditions that initiate a chemical reaction involving the precursor or reduction or decomposition products of the precursor, wherein the material is deposited on the surface of the substrate when the substrate and the reaction reagent are in contact with the solution, while maintaining supercritical or near-supercritical conditions.

The invention also includes a method of depositing a material onto a substrate by i) dissolving a precursor or mixture of precursors of the material into a solvent to form a supercritical or near-supercritical solution; and ii) adding a reaction reagent in the solution under conditions that initiate a chemical reaction involving the precursor or reduction or decomposition products of the precursor, wherein the material is deposited on the surface of the substrate when the substrate and the reaction reagent are in contact with the solution, while maintaining supercritical or near-supercritical conditions.

As used herein, a "supercritical solution" (or solvent) is one in which the temperature and pressure of the solution (or solvent) are greater than the respective critical temperature and pressure of the solution (or solvent). A supercritical condition for a particular solution (or solvent) refers to a condition in which the temperature and pressure are both respectively greater than the critical temperature and critical pressure of the particular solution (or solvent).

A "near-supercritical solution" (or solvent) is one in which the reduced temperature (actual temperature measured in Kelvin divided by the critical temperature of the solution (or solvent) measured in Kelvin) and reduced pressure (actual pressure divided by critical pressure of the solution (or solvent)) of the solution (or solvent) are both greater than 0.8 but the solution (or solvent) is not a supercritical solution. A near-supercritical condition for a particular solution (or solvent) refers to a condition in which the reduced temperature and reduced pressure are both respectively greater than 0.8 but the condition is not supercritical. Under ambient conditions, the solvent can be a gas or liquid. The term solvent is also meant to include a mixture of two or more different individual solvents.

The "aspect ratio" of a feature on a patterned substrate is the ratio of the depth of the feature and the width of the feature.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, the preferred methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The invention includes a number of advantages, including the use of process temperatures that are much lower than conventional CVD temperatures. A reduction in process temperature is advantageous in several respects: it aids in the control of depositions, minimizes residual stress generated by thermal cycling in multi-step device fabrication that can lead to thermal-mechanical failure, minimizes diffusion and reaction of the incipient film with the substrate and/or adjacent layers, renders the deposition process compatible with thermally labile substrates such as polymers, and suppresses thermally-activated side-reactions such as thermal fragmentation of precursor ligands that can lead to film contamination. Thus, the films produced by the process are substantially free of impurities, e.g., ligand-derived impurities.

An additional advantage of the invention is that it obviates the CVD requirement of precursor volatility since the process is performed in solution. Thus, the process can be conducted at fluid phase precursor concentrations between 10 and 10,000 times or more higher than conventional gas phase processes, which mitigates mass transfer limitations and promotes conformal coverage. Furthermore, since the process is performed under supercritical or near-supercritical conditions, the diffusivity of precursors dissolved in solution is increased relative to liquid solutions, thereby enhancing transport of precursor and reaction reagent to, and decomposition products away from, the incipient film. The supercritical fluid is also a good solvent for ligand-derived decomposition products, and thus facilitates removal of potential film impurities and increases the rate at which material forms on the substrate in cases where this rate is limited by the desorption of precursor decomposition products. In addition, since the reactants are dissolved into solution, precise control of stoichiometry is possible.

This latter consideration permits mixed metal depositions, e.g., alloys, because transport is based on solubility rather than volatility. Thus, multicomponent films can be prepared by co-reduction of appropriate organometallic compounds, and the composition of the multicomponent film can be controlled directly by stoichiometric adjustments to the fluid phase precursor concentrations.

Another advantage of the invention is that the supercritical solution is usually miscible with gas phase reaction reagents such as hydrogen. As a result, gas/liquid mass transfer limitations common to reactions in liquid solvents are eliminated, and so excess quantities of the reaction reagent can easily be used in the reaction forming the material. Thus, the techniques produce high quality metal and metal alloy deposits of precisely tailored composition in the form of thin films, conformal coatings on topologically complex surfaces, uniform deposits within high aspect ratio features, and both continuous and discreet deposits within microporous supports. Moreover, the absence of surface tension inherent to supercritical solutions ensures complete wetting of tortuous surfaces. In addition, the elimination of the volatility requirement removes constraints on precursors, and enables the use of non-fluorinated precursors that contain environmentally benign ligands.

Other features and advantages of the invention will be apparent from the following detailed description, and from the claims.

DETAILED DESCRIPTION

Figure 1:
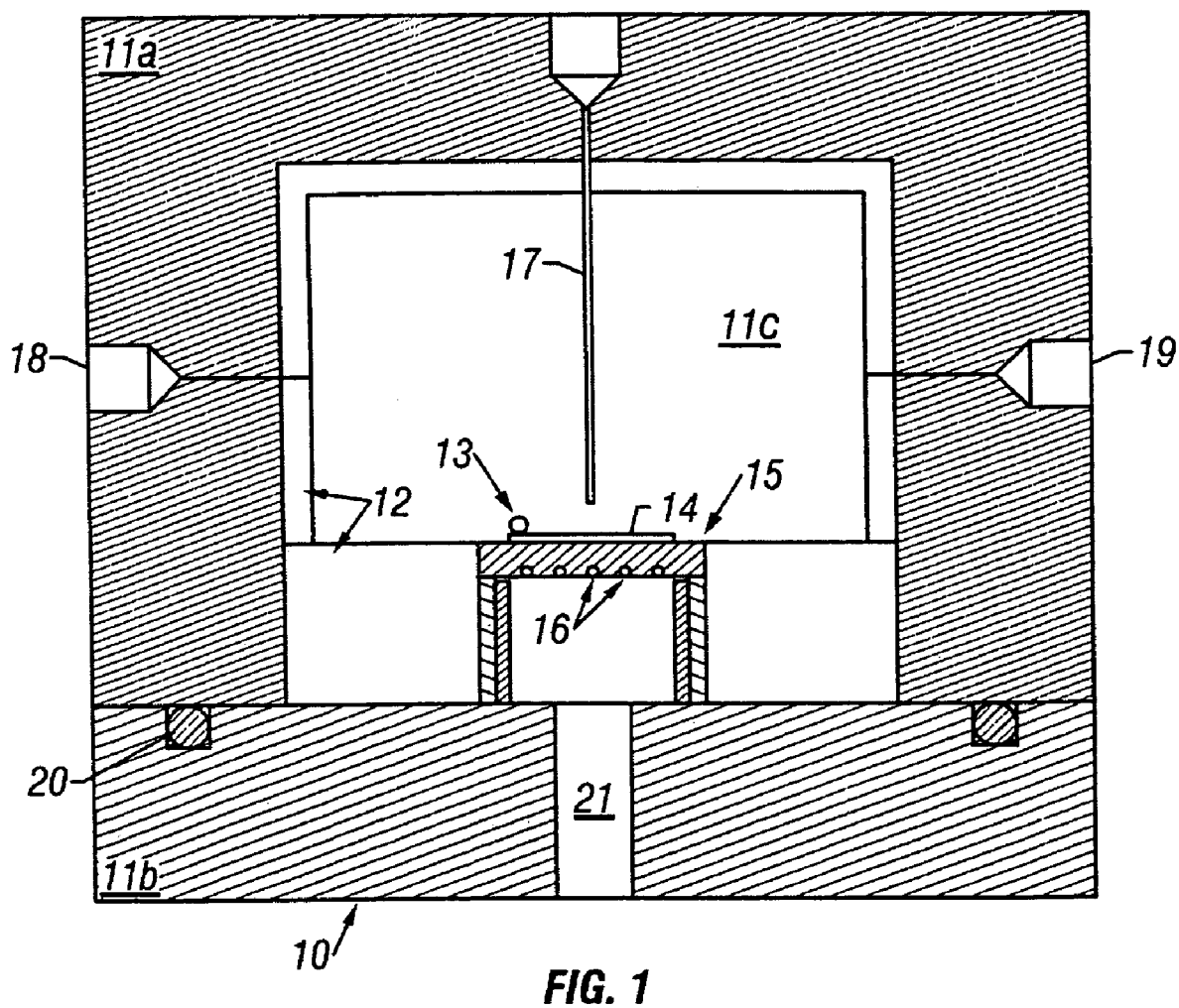
FIG. 1 is a schematic of a double flange, cold-wall reactor for use in certain of the methods described herein.

Chemical Fluid Deposition (CFD) is a process by which materials (e.g., metals, metal mixtures or alloys, metal oxides, or semiconductors) are deposited from a supercritical or near-supercritical solution via chemical reaction of soluble precursors. Desired materials can be deposited on a substrate as a high-purity (e.g., better than 95, 97, or even 99%) or multicomponent metal mixture or alloy thin film (e.g., less than 10, 8, 5, or 3 microns), a conformal coating on a topologically complex surface, and as both a continuous and/or discreet deposit within a microporous support. The substrate can be, e.g., a metal, a semiconductor, or a polymer, can be patterned with a complex surface, and can include one or more previously formed layers or coatings. The supercritical fluid transports the precursor to the substrate surface where the reaction takes place and transports ligand-derived decomposition products away from the substrate thereby removing potential film impurities. Typically, the precursor is unreactive by itself and a reaction reagent (e.g., a reducing or oxidizing agent) is mixed into the supercritical solution to initiate the reaction, which forms the desired materials. The entire process takes place in solution under supercritical conditions. The process provides high-purity films at various process temperatures under about 300° C. (e.g., below 275, 250, 225, 210, 200, 175, 150, 125, 100, 80, 60, or even 40° C.), depending on the precursors, solvents, and process pressure used.

CFD can be used, for example, to deposit platinum (Pt) and palladium (Pd) films onto silicon wafers or fluoropolymer substrates. In these examples, process temperatures of as low as 80° C. provide a film purity that can be better than 99%. CFD can also be used for deposition of multicomponent alloy films, e.g., nickel/platinum (Ni/Pt) alloys of increasing Ni composition spanning the composition range between the two elements. The composition of the alloy is dictated by the stoichiometric ratio of the precursors in supercritical $CO_2$ solution. Furthermore, CFD can be used to provide complete conformal and uniform coverage of patterned substrates such as patterned silicon (Si) wafers having feature sizes as small as, e.g., 0.1 microns wide by 1.0 micron deep. A complete description of such examples and others are given below.

CFD can also be used to deposit materials into mesoporous or microporous inorganic solids. Examples include the metallization of nanometer-size pores in catalyst supports such as silicalites and amorphous mesoporous aluminosilicate molecular sieves. Supercritical fluids have gas-like transport properties (e.g., low viscosity and absence of surface tension) that ensure rapid penetration of the pores. Uniform deposition throughout the pores is further facilitated by independent control of the transport (via solution) and deposition (via reaction reagent) mechanisms in CFD. In addition, CFD can be used to prepare metal or metal alloy membranes formed within porous substrates such as alumina. By contrast, metallization of porous substrates by CVD often results in choking of the pores by rapid deposition at the pore mouth.

General Method of Using a Hot-Wall Reactor

A batch CFD run in a "hot-wall" reactor involves the following general procedure. A single substrate and a known mass of precursor (which can include precursor materials for multiple components) are placed in a reaction vessel (e.g., a stainless steel pipe), which is sealed, purged with solvent, weighed, and immersed in a circulating controlled temperature bath (thereby heating the walls of the reactor). The vessel is then filled with solvent using a high-pressure transfer manifold. The contents of the reactor are mixed using a vortex mixer and conditions are brought to a specified temperature and pressure at which the solvent is a supercritical or near-supercritical solvent. The mass of solvent transferred into the reaction vessel is determined gravimetrically using standard techniques. The vessel is maintained at this condition (at which the precursor is unreactive) for a period of time, e.g., up to one hour or longer, sufficient to ensure that the precursor has completely dissolved and that the reaction vessel is in thermal equilibrium.

A reaction reagent is then transferred through a manifold connected to the reaction vessel. The reaction reagent can be a gas or a liquid, or a gas, liquid, or solid dissolved in a supercritical solvent. The transfer manifold is maintained at a pressure in excess of that of the reaction vessel. The mass of reaction reagent transferred into the reaction vessel is usually in molar excess relative to the precursor. The reaction is typically carried out for at least one hour, although the reaction may be completed in much less than one hour, e.g., less than 30, 20, 10, or 5 minutes, or less than 180, 120, 60 or 30 seconds. The optimal length of reaction time can be determined empirically. When the reactor has cooled, the substrate is removed and can be analyzed.

A variation of the batch process involves heating the substrate by placing it on a resistance heater within the high-pressure vessel. These experiments are conducted within a dual flange "cold-wall" reactor as described in further detail below.

A continuous CFD process is similar to the above batch method except that known concentrations of the supercritical (or near-supercritical) solution and reaction reagent are taken from separate reservoirs and continuously added to a reaction vessel containing multiple substrates as supercritical solution containing precursor decomposition products or unused reactants is continuously removed from the reaction vessel. The flow rates into and out of the reaction vessel are made equal so that the pressure within the reaction vessel remains substantially constant. The overall flow rate is optimized according to the particular reaction. Prior to introducing precursor-containing solution into the reaction vessel, the reaction vessel is filled with neat solvent (which is the same as the solvent in the precursor solution) at supercritical or near-supercritical pressures and is heated to supercritical or near-supercritical temperatures. As a result, supercritical or near-supercritical conditions are maintained as the precursor-containing solution is initially added to the reaction vessel.

Solubility of the precursor at the reaction conditions can be verified in a variable volume view cell, which is well known in the art (e.g., McHugh et al, *Supercritical Fluid Extraction: Principles and Practice*; Butterworths, Boston, 1986). Known quantities of precursor and supercritical solvent are loaded into the view cell, where they are heated and compressed to conditions at which a single phase is observed optically. Pressure is then reduced isothermally in small increments until phase separation (either liquid-vapor or solid-vapor) is induced.

The temperature and pressure of the process depend on the reactants and choice of solvent. Generally, temperature is less than 300° C. (e.g., 275, 250, 225, 210, 200, 180, 160, 150, or 125° C.) and often less than 100° C., while the pressure is typically between 50 and 500 bar (e.g., between 100 and 400, 100 to 150, or 150 to 250 bar). A temperature gradient between the substrate and solution can also be used to enhance chemical selectivity.

General Two-Step Method

A two-step method can be used in situations where a desired metal or metal alloy, such as copper, is not readily deposited on a substrate, especially a patterned substrate, using conventional plating techniques or even the new CFD methods described herein. In these situations, a uniform seed layer, e.g., of clusters, is prepared from a material, such as Pd, Pt, or Cu, which can activate the substrate and serve as a catalytic site on which the desired metal or metal alloy can be deposited in the second step.

The first step of the method can be similar to the general method described above with respect to the hot-wall reactor. The first step can also be achieved by a variety of other methods described in further detail below with respect to use in a "cold-wall" reactor.

As shown in the examples described herein, reactive depositions of precursors from supercritical fluids can yield a seed layer of small Pd clusters that is an active catalyst for the second step, e.g., the electroless deposition of another metal, such as Cu, within sub 150 nm wide, high-aspect ratio features. The seed layer created by the first step need not be continuous, but the isolated catalytic seed clusters must be distributed uniformly in the features of a patterned substrate, i.e., the seed layer must uniformly cover the walls of any trenches. The clusters, rather than a thin film, are obtained by controlling the concentration of the metal precursor in the supercritical fluid or solvent. For example, discrete clusters are obtained using precursor concentrations of less than 0.1 percent by mass, whereas thin films are formed using precursor concentrations of greater than 0.1 percent, and typically 0.2, 0.3, 0.5 percent, or greater. Seed layers comprising clusters rather than a continuous film of material are often preferred, because it is the second layer, e.g., a film of copper, that has the desired function(s), e.g., conductivity, and the seed layer can interfere with the desired function. Therefore, it is often beneficial to minimize the amount of precursor material used to deposit the seed layer, and uniformly distributed clusters have less mass than a continuous film covering the same surface area.

Variations of the process include control of Pd cluster size with specific chemical functional groups introduced onto the surface of the substrate via coupling agents, such as silane coupling agents. A wide variety of coupling agents is available commercially, e.g., from Gelest, Inc., Tullytown, Pa. In addition, functional groups can be bound to substrate surfaces using a variety of other approaches. For example, functional groups can be bound to surfaces using plasma surface modification, e.g., as described in U.S. Pat. Nos. 4,900,618 and 4,910,072 to Monsanto, or by using polymers with specific functional groups, e.g., as described in U.S. Pat. No. 4,869,930 issued to IBM. The role of the functional group is to bind to the Pd precursor during its introduction, and the coupling agents, and thus the functional groups, can be selectively bound to the surface in discrete locations, e.g., by masking or selective removal techniques. The bound organometallic, e.g., bound in only certain regions of the substrate, is subsequently reduced in the supercritical solvent or after removal of the supercritical solvent. By allowing the precursor to bind to the functional groups prior to reduction, one can carefully control the size of the clusters as well as the location of the bound precursor, which is then reduced only after any unbound precursor is removed from the substrate surface.

In addition, Cu seed layers, e.g., in the form of clusters, can be deposited by the reduction of various organocopper compounds in supercritical fluids. Cu precursors, include, but are not limited to, Cu(II) beta diketonates such as Cu(hfac)$_2$, Cu(hfac)$_2$ hydrate, bis(6,6,7,7,8,8,8-heptafluoro-2,2-dimethyl-3-5-octanedionate)copper(II), bis(2,2,6,6,-tetramethyl-3,5-heptanedionato)copper(II), and Copper (II) acetylacetonate. Cu(I) precursors, include, but are not limited to, (β-diketonate)CuL compounds where L is a ligand that can include alkynes, phosphines, olefins, cyclooctadiene, and vinyl trimethysilane. The Cu seed layer can be formed from the precursor by either mixing with a reaction reagent, by thermal disproportionation, or by other reduction pathways.

The second step of the two-step method can be a standard electroless or electrolytic plating step, or subsequent CFD as described herein. One embodiment is the use of commercial plating baths such as the M-Copper 85 plating system from MacDermid Incorporated or other plating systems from other sources. Such plating methods are described, e.g., in Dubin, et al., *J. Electrochem. Soc.*, 144:898–098 (1997).

General Method of Using a Cold-Wall Reactor

A variation of the batch process described above involves a dual flange, "cold-wall" reactor in which the substrate is placed on top of a resistively heated stage. As shown in FIG. 1, the reactor housing is made of a stainless steel top flange 11a, and a stainless steel bottom flange 11b connected to top flange, e.g., via bolts (not shown). The top and bottom flanges are sealed with an O-ring seal 20, e.g., a Buna rubber O-ring. The inside of the top flange 11a and the surface of the bottom flange 11b are both lined with a TEFLON liner 12 to create an internal chamber 11c. A heated substrate stage 15, which can be heated, e.g., by a nickel-chromium resistance heater 16 potted into the stage with potting cement, is arranged within this chamber 11c.

The substrate 14 to be coated is placed on stage 15. A thermocouple 13 located on the stage 15, and preferably contacting the substrate 14, is connected to a temperature controller through high pressure feed-through (wires not shown), and is used to monitor and control the temperature of the substrate. Reactor housing 10 also includes a high pressure (e.g., 1/16") line 17 for reactant feed, a first port 18 for rupture disk, feeds, outlets, thermocouples, pressure measurement, etc., and a second port 19 for rupture disk, feeds, outlets, thermocouples, pressure measurement, etc. In addition, the housing has a third port 21 for high pressure feed-through (wires not shown).

The temperature of the stage 15, and the substrate contacting the stage, is controlled by regulating power delivered to the heater using a temperature controller (e.g., PID controller). In a typical experiment, a single substrate 14 is placed on stage 15, and a known mass of precursor (which can include precursor materials for multiple components) is placed in the reactor 10. The reactor is then heated to the desired temperature, typically 40–80° C. and filled with solvent using a high-pressure manifold or a computer controlled syringe pump, and the contents are brought to a specified temperature and pressure at which the solvent is a supercritical or near-supercritical solvent. The vessel is maintained at this condition (at which the precursor is unreactive) for a period of time, e.g., up to one hour or longer, sufficient to ensure that the precursor has completely dissolved. The substrate is then heated to a specific temperature, typically 150–250° C. on the stage, which is higher than the bulk temperature of the supercritical solvent/precursor mixture.

In one embodiment, a reaction reagent is then transferred through a manifold connected to the reaction vessel. The reaction reagent can be a gas or a liquid, or a gas, liquid, or solid dissolved in a supercritical solvent. The transfer manifold is maintained at a pressure in excess of that of the reaction vessel. The mass of reaction reagent transferred into the reaction vessel is usually in molar excess relative to the precursor. The reaction is typically carried out for at least one hour, although the reaction may be completed in much less than one hour, e.g., less than 30, 20, 10, or 5 minutes, or less than 180, 120, 60, or 30 seconds. The optimal length of reaction time can be determined empirically. When the reactor has cooled, the substrate is removed and can be analyzed. This method can be employed as a single-step deposition on an unseeded substrate or as a two-step method as described above, where a catalytic seed layer is first deposited on the substrate and a metal film of the same or different composition is deposited on the seeded substrate.

Variations of this method, which apply in both the cold-wall and hot-wall reactors, include (i) deposition of the seed layer by CFD followed by metal deposition by other techniques including CVD or electroless or electrolytic plating; (ii) deposition of a seed layer using any technique including sputtering, CVD, electroless plating, thermolysis, or other reactions at the substrate surface followed by CFD; and (iii) deposition of both the seed layer and metal film by CFD; and sequential and/or simultaneous combinations of methods.

One embodiment of deposition in a cold-wall or hot-wall reactor includes multiple reactions from one precursor or a precursor and its reaction products. For example, Cu films can be deposited onto a variety of substrates, e.g., silicon, metals, glasses, polyimides, various oxides such as silicon oxides, and nitrides such as titanium nitrides, from Cu(I) precursors of the general type (β-diketonate)CuL$_n$, where L is a Lewis base, and n is 1 or 2. A precursor, or mixture of precursors of this type, are dissolved in CO$_2$ as described above. The temperature of the substrate is then increased to initiate a thermal disproportionation reaction that yields a copper deposit according to the following reaction:

The addition of a reaction reagent then reduces the Cu$^{(II)}$(β-diketonate)$_2$ resulting in the deposition of additional copper. These reactions can be conducted sequentially or simultaneously.

In one embodiment the precursor is copper (I) (hexafluoroacetyl-acetonate)(2-butyne) (Cu(hfac)(2-butyne)), and the deposition from Cu(hfac)(2-butyne) occurs via a two step-step reaction. The first step is shown below and occurs via a disproportionation reaction. This reaction does not require hydrogen and is thermally induced. At sufficiently high temperature, the reaction is nonselective, i.e., deposition occurs on all surfaces, whether or not seeded, and whether or not metallic. The disproportionation reaction deposits a seed layer of copper on any surface, including metals, metal oxides, nitrides, glasses, and polymers.

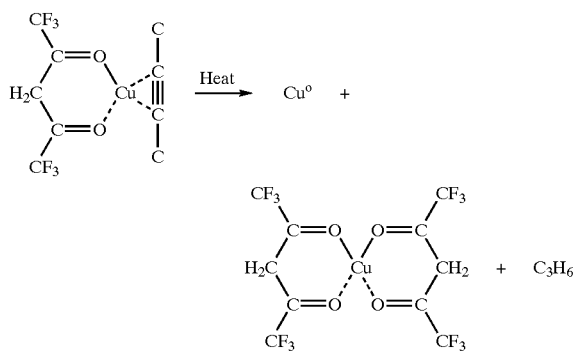

The second step is the reduction of the Cu(hfac)$_2$ formed during the disproportionation reaction, which occurs via a hydrogen reduction. The reaction occurs preferentially on an active metallic surface such as nickel, palladium, platinum, aluminum, copper, etc., such that the reduction of the Cu(hfac)$_2$ can then occur on the seed layer deposited thermally.

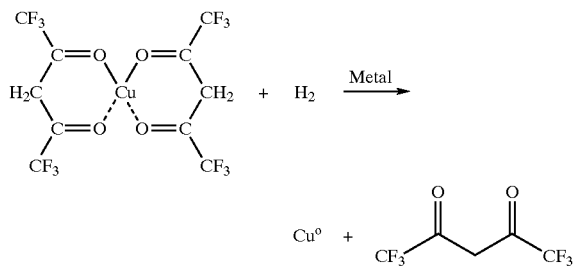

There are several advantages to this variation, which include elimination of a separate step for deposition of the seed layer and hydrogen reduction of the thermal disproprotionation products that also allows for much higher atomic efficiency (approaching 100%) than the disproportionation reaction alone, which results in an efficiency of at best 50%. Variations of this process include conducting the disproportionation and reduction reactions simultaneously or sequentially, and the use of mixtures of precursors including mixtures of ($\beta$-diketonate)Cu$^{(I)}$L$_n$ and Cu$^{(II)}$($\beta$-diketonate)$_2$.

To promote film purity, a preferred embodiment is to maintain the temperature of the reactor and substrate at conditions that avoid thermal degradation of the liberated ligands and ligand products. For example it is known in the art that use of excessive reaction temperatures (greater than ~500K) for deposition of Cu from Cu$^{(II)}$($\beta$-diketonate)$_2$ compounds can lead to the formation of carbon impurities by thermal decomposition of the ligand and ligand decomposition intermediates (see, e.g., Girolami et al., *J. Am. Chem. Soc.*, 115:1015–1024, 1993).

Solvents

Solvents useful as supercritical fluids are well known in the art and are sometimes referred to as dense gases (Sonntag et al., *Introduction to Thermodynamics, Classical and Statistical*, 2nd ed., John Wiley & Sons, 1982, p. 40). At temperatures and pressures above certain values for a particular substance (defined as the critical temperature and critical pressure, respectively), saturated liquid and saturated vapor states are identical and the substance is referred to as a supercritical fluid. Solvents that are supercritical fluids are less viscous than liquid solvents by one to two orders of magnitude. In CFD, the low viscosity of the supercritical solvent facilitates improved transport (relative to liquid solvents) of reagent to, and decomposition products away, from the incipient film. Furthermore, many reagents that would be useful in chemical vapor deposition are insoluble or only slightly soluble in various liquids and gases and thus cannot be used in standard CVD. However, the same reagents often exhibit increased solubility in supercritical solvents. Generally, a supercritical solvent can be composed of a single solvent or a mixture of solvents, including for example a small amount (<5 mol %) of a polar liquid co-solvent such as methanol.

It is important that the reagents are sufficiently soluble in the supercritical solvent to allow homogeneous transport of the reagents. Solubility in a supercritical solvent is generally proportional to the density of the supercritical solvent. Ideal conditions for CFD include a supercritical solvent density of at least 0.1 to 0.2 g/cm$^3$ or a density that is at least one third of the critical density (the density of the fluid at the critical temperature and critical pressure).

Table 1 below lists some examples of solvents along with their respective critical properties. These solvents can be used by themselves or in conjunction with other solvents to form the supercritical solvent in CFD. Table 1 lists the critical temperature, critical pressure, critical volume, molecular weight, and critical density for each of the solvents.

TABLE 1

Critical Properties of Selected Solvents

| Solvent | $T_c$ (K) | $P_c$ (atm) | $V_c$ (cm/mol) | Molecular Weight | $\rho_c$ (g/cm$^3$) |
|---|---|---|---|---|---|
| CO$_2$ | 304.2 | 72.8 | 94.0 | 44.01 | 0.47 |
| C$_2$H$_6$ | 305.4 | 48.2 | 148 | 30.07 | 0.20 |
| C$_3$H$_8$ | 369.8 | 41.9 | 203 | 44.10 | 0.22 |
| n-C$_4$H$_{10}$ | 425.2 | 37.5 | 255 | 58.12 | 0.23 |
| n-C$_5$H$_{12}$ | 469.6 | 33.3 | 304 | 72.15 | 0.24 |
| CH$_3$—O—CH$_3$ | 400 | 53.0 | 178 | 46.07 | 0.26 |
| CH$_3$CH$_2$OH | 516.2 | 63.0 | 167 | 46.07 | 0.28 |
| H$_2$O | 647.3 | 12.8 | 65.0 | 18.02 | 0.33 |
| C$_2$F$_6$ | 292.8 | 30.4 | 22.4 | 138.01 | 0.61 |

To describe conditions for different supercritical solvents, the terms "reduced temperature," "reduced pressure," and "reduced density" are used. Reduced temperature, with respect to a particular solvent, is temperature (measured in Kelvin) divided by the critical temperature (measured in Kelvin) of the particular solvent, with analogous definitions for pressure and density. For example, at 333 K and 150 atm, the density of CO$_2$ is 0.60 g/cm$^3$; therefore, with respect to CO$_2$, the reduced temperature is 1.09, the reduced pressure is 2.06, and the reduced density is 1.28. Many of the properties of supercritical solvents are also exhibited by near-supercritical solvents, which refers to solvents having a reduced temperature and a reduced pressure both greater than 0.8, but not both greater than 1 (in which case the solvent would be supercritical). One set of suitable conditions for CFD include a reduced temperature of the supercritical or near-supercritical solvent of between 0.8 and 1.6 and a critical temperature of the fluid of less than 150° C.

Carbon dioxide (CO$_2$) is a particularly good choice of solvent for CFD. Its critical temperature (31.1° C.) is close to ambient temperature and thus allows the use of moderate process temperatures (<80° C.). It is also unreactive with most precursors used in CVD and is an ideal media for running reactions between gases and soluble liquids or solid substrates. Other suitable solvents include, for example, ethane or propane, which may be more suitable than $CO_2$ in certain situations, e.g., when using precursors which can react with $CO_2$, such as complexes of low-valent metals containing strong electron-donating ligands (e.g., phosphines).

Precursors and Reaction Mechanisms

Precursors are chosen so that they yield the desired material on the substrate surface following reaction with the reaction reagent. Materials can include metals (e.g., Cu, Pt, Pd, and Ti), elemental semiconductors (e.g., Si, Ge, and C), compound semiconductors (e.g., III–V semiconductors such as GaAs and InP, II–VI semiconductors such as CdS, and IV–VI semiconductors such as PbS), oxides (e.g., $SiO_2$ and $TiO_2$), or mixed metal or mixed metal oxides (e.g., a superconducting mixture such as Y—Ba—Cu—O). Organometallic compounds and metallo-organic complexes are an important source of metal-containing reagents and are particularly useful as precursors for CFD. In contrast, most inorganic metal-containing salts are ionic and relatively insoluble, even in supercritical fluids that include polar modifiers such as methanol.

Some examples of useful precursors for CFD include metallo-organic complexes containing the following classes of ligands: beta-diketonates (e.g., $Cu(hfac)_2$ or $Pd(hfac)_2$, where hfac is an abbreviation for 1,1,1,5,5,5-hexafluoro-acetylacetonate), alkyls (e.g., $Zn(ethyl)_2$ or dimethylcyclooctadiene platinum ($CODPtMe_2$)), allyls (e.g. bis(allyl) zinc or $W(\eta^4\text{-allyl})_4$), dienes (e.g., $CODPtMe_2$), or metallocenes (e.g., $Ti(\eta^5\text{-}C_5H_5)_2$ or $Ni(\eta^5\text{-}C_5H_5)_2$). For a list of additional potential precursors see, for example, M. J. Hampden-Smith and T. T. Kodas, *Chem. Vap. Deposition*, 1:8 (1995).

Precursor selection for CVD is limited to stable organometallic compounds that exhibit high vapor pressure at temperatures below their thermal decomposition temperature. This limits the number of potential precursors. CFD obviates the requirement of precursor volatility and replaces it with a much less demanding requirement of precursor solubility in a supercritical fluid.

Any reaction yielding the desired material from the precursor can be used in CFD. However, low process temperatures (e.g., less than 300, 275, 250, 200, 150, or 100° C.) and relatively high fluid densities (e.g., greater than 0.1 to 0.2 g/cm³) in the vicinity of the substrate are important features of CFD. If the substrate temperature is too high, the density of the fluid in the vicinity of the substrate approaches the density of a gas, and the benefits of the solution-based process are lost. In addition, a high substrate temperature can promote deleterious fragmentation and other side-reactions that lead to film contamination. Therefore a reaction reagent, rather than thermal activation, is used in CFD to initiate the reaction that yields the desired material from the precursor.

For example, the reaction can involve reduction of the precursor (e.g., by using $H_2$ or $H_2S$ as a reducing agent), oxidation of the precursor (e.g., by using $O_2$ or $N_2O$ as an oxidizing agent), or hydrolysis of the precursor (i.e., adding $H_2O$). An example of an oxidation reaction in CFD is the use of $O_2$ (the reaction reagent) to oxidize a zirconium beta-diketonate (the precursor) to produce a metal thin film of $ZrO_2$. An example of a hydrolysis reaction in CFD is water (the reaction reagent) reacting with a metal alkoxide (the precursor), such as titanium tetraisopropoxide (TTIP), to produce a metal oxide thin film, such as $TiO_2$. The reaction can also be initiated by optical radiation (e.g., photolysis by ultraviolet light). In this case, photons from the optical radiation are the reaction reagent.

Chemical selectivity at the substrate can be enhanced by a temperature gradient established between the substrate and the supercritical solution. For example, a gradient of 40° C. to 250° C. or 80° C. to 150° C. can be beneficial. However, to maintain the benefits of CFD, the temperature of the substrate measured in Kelvin divided by the average temperature of the supercritical solution measured in Kelvin is typically between 0.8 and 1.7.

In some cases, the supercritical fluid can participate in the reaction. For example, in a supercritical solution including $N_2O$ as a solvent and metal precursors such as organometallic compounds, $N_2O$ can serve as an oxidizing agent for the metal precursors yielding metal oxides as the desired material. In most cases, however, the solvent in the supercritical fluid is chemically inert.

In the two-step process, the precursors and reaction mechanisms are as described above. In the second step, a metal layer or film is deposited onto the seed layer, which serves as a catalyst for metallization. This second step can be electroless or electrolytic deposition or a second CFD step. Electroless plating baths contain metal salts, liquid reducing agents such as formaldehyde or hydrogen cyanide, stabilizers, and other components. For example, components of copper plating baths are commercially available and often include copper sulfate, formaldehyde, NaOH, chelating agents, and proprietary additives. An example is the M-Copper 85 plating system available from MacDermid Incorporated. Electrolytic plating solutions are also commercially available and often contain copper sulfate as the metal salt, and various additives including sulfuric acid and hydrochloric acid.

EXAMPLES

The invention is further described in the following examples, which do not limit the scope of the invention described in the claims.

1. Platinum Film on a Silicon Wafer

A platinum metal film was deposited onto a silicon wafer by reduction of dimethylcyclooctadiene platinum(II) ($CODPtMe_2$) with hydrogen gas in a supercritical $CO_2$ solution. Polished silicon test wafers (orientation: <100>, Boron doped type P, 450 microns thick), carbon dioxide (99.99%), and hydrogen gas (pre-purified grade) were commercially obtained and used without modification. $CODPtMe_2$ is useful because of its high platinum content (58.5 wt. %), low toxicity of the ligands, and heptane solubility, which is a good indicator of solubility in $CO_2$. Prior to CFD, solubility measurements of $CODPtMe_2$ in $CO_2$ were preformed in a view cell. Results indicated that the solubility of the precursor was greater than 1% by weight at 40° C. and 100 bar and that no degradation of precursor was observed over a range of temperatures up to 80° C.

$CODPtMe_2$ was dissolved into supercritical $CO_2$ at 80° C. and 155 bar to produce a 0.6% by weight precursor solution. The reaction vessel containing the precursor solution and silicon wafer was allowed to equilibrate for 2 hours. The precursor was then reduced by the addition of approximately 15× molar excess of $H_2$ gas. Reduction resulted in the deposition of continuous, reflective Pt films on the silicon wafers. Scanning electron microscopy (SEM) analysis of the film revealed well-defined 80–100 nm platinum crystals. The platinum film was approximately 1.3 microns thick and uniform as determined by SEM analysis of fracture cross-sections of the composite.

Figure 2A:
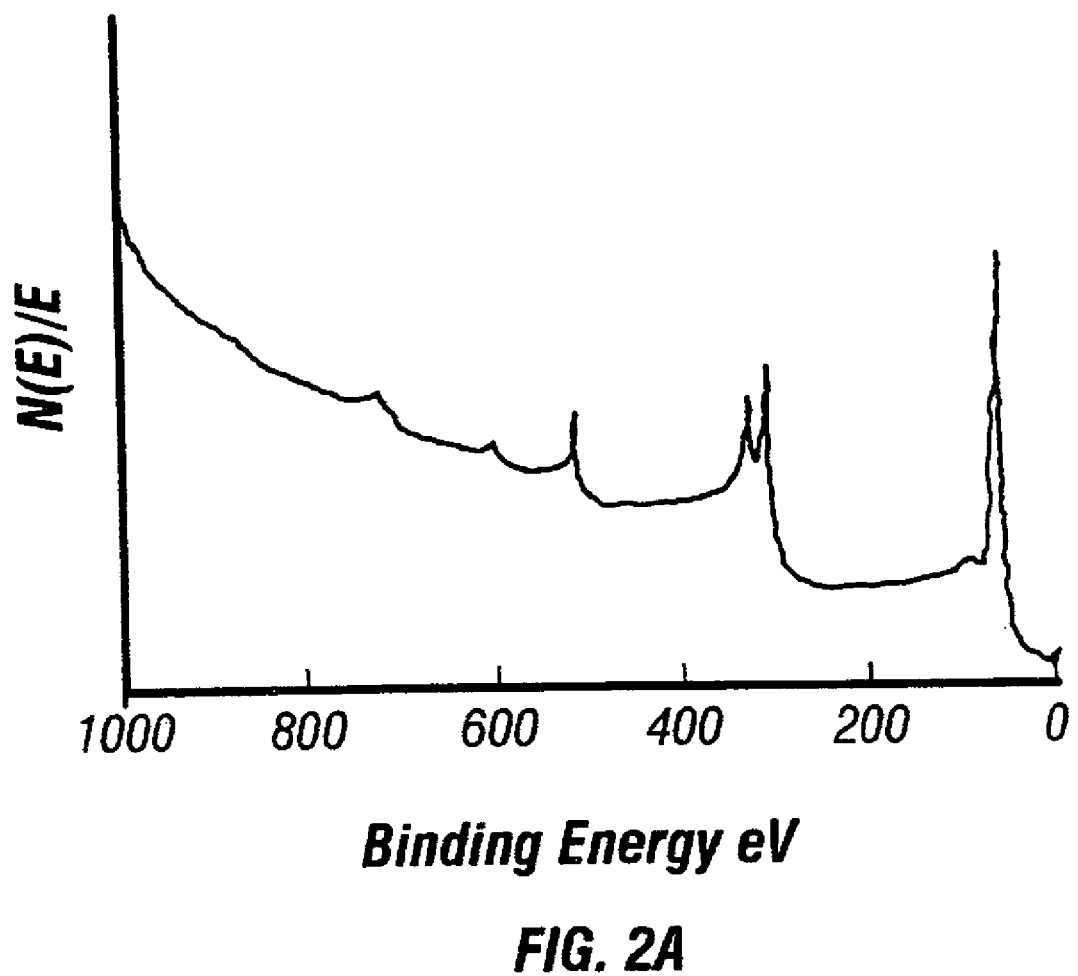
FIG. 2A is an X-ray photoelectron spectroscopy (XPS) survey spectra (75° take-off angle) of a platinum film deposited on a silicon wafer using CFD. Results are shown after sputter cleaning with $Ar^+$ ions to remove atmospheric contamination.

X-ray photoelectron spectroscopy (XPS) indicated that the film was free of ligand-derived contamination. XPS was performed using a spectrometer employing Mg Kα excitation (400 W 15.0 kV). FIG. 2A shows an XPS survey spectrum taken after sputter cleaning with Ar$^+$ ions to remove atmospheric contaminates. The spectrum gives the normalized number of electrons (in arbitrary units) ejected from a site in the film as a function of the binding energy of that site. The small $C_{1s}$ carbon peak (284 eV) observed in the spectrum of the sputtered deposit is at the detection limit of the instrument and could not be meaningfully quantified by multiplex analysis. The continuity of the film was confirmed by the absence of $Si_{2s}$ peaks at 153 eV ($Si_{2p}$ peaks at 102 and 103 eV would be obscured by the $Pt_{5s}$ photoelectron line). Pt photoelectron lines are observed at the following energies: $4f_{7/2}=73$ eV, $4f_{5/2}=76$ eV, $4d_5=316$ eV, $4d_3=333$ eV, $4p_3=521$ eV, $4p_1=610$ eV, and $4s=726$ eV. For a reference on XPS see Christmann, *Introduction to Surface Physical Chemistry*; Springer-Verlag:New York (1991), Chap. 4.

2) Platinum Film on a Fluoropolymer Substrate

Platinum metal was deposited on a 0.95 gram sample of 0.9 mm thick sheet of polytetrafluoroethylene (PTFE) by reduction of CODPtMe$_2$ with H$_2$ gas, as generally described in Example 1. A 1.2% by weight solution of CODPtMe$_2$ in CO$_2$ was equilibrated with the PTFE sample at 80° C. and 155 bar for 4 hours. The precursor was then reduced by the addition of a 15× molar excess of H$_2$ gas. Following deposition, the sample exhibited a bright reflective coating. An SEM image of the surface of the sample indicated the presence of relatively large platinum crystals. Platinum clusters were also observed in the bulk of the sample by transmission electron microscopy (TEM) analysis of interior sections of the sample obtained by cryogenic microtomy.

3) Platinum Deposited within Porous Aluminum Oxide

Anopore™ aluminum oxide (Al$_2$O$_3$) membranes having 200 nm straight pores were obtained from Whatman International Ltd. (Maidstone, England) and used as a porous solid substrate. The pores are oriented perpendicular to the surface, are approximately hexagonally packed, and exhibit a narrow pore size distribution.

An 11.3 mg sample of an Al$_2$O$_3$ membrane was exposed to a 0.74 wt. % solution of CODPtMe$_2$ in CO$_2$ at 80° C. and 155 bar for two hours in a small (ca. 3 ml) reaction vessel. CODPtMe$_2$ was then reduced by the addition of H$_2$ gas, resulting in the deposition of platinum, as was done in Examples 1 and 2. After deposition, the surface of the membrane was metallic-gray in color. A sample of the metallized membrane was cast in epoxy and cross-sectioned by cryomicrotomy. TEM analysis of the sections indicated the presence of small Pt clusters distributed throughout the pores. Pt deposition within a second membrane at similar conditions (0.68 wt. % CODPtMe$_2$, 80° C., 155 bar, 2 hours, followed by reduction with H$_2$) yielded similar results. Analysis of the second membrane by SEM revealed small Pt clusters distributed throughout the pores.

4) Palladium Film on a Silicon Wafer

Palladium metal films were deposited by the hydrogenolysis of palladium (II) hexafluoroacetylacetonate (Pd(hfac)$_2$) in supercritical CO$_2$. Solubility of Pd(hfac)$_2$ in CO$_2$ was predicted based on the presence of the fluorinated ligands and confirmed by experiments in a view cell. With the exception of the precursor, Pd(hfac)$_2$, the procedure was similar to the one used in Example 1. A Si wafer in contact with a 0.62% by weight solution of Pd(hfac)$_2$ in CO$_2$ was equilibrated at 80° C. and 155 bar for 2 hours. The precursor was then reduced by the addition of a 15× molar excess of H$_2$ gas. The process produced a bright and reflective Pd film.

Figure 2B:
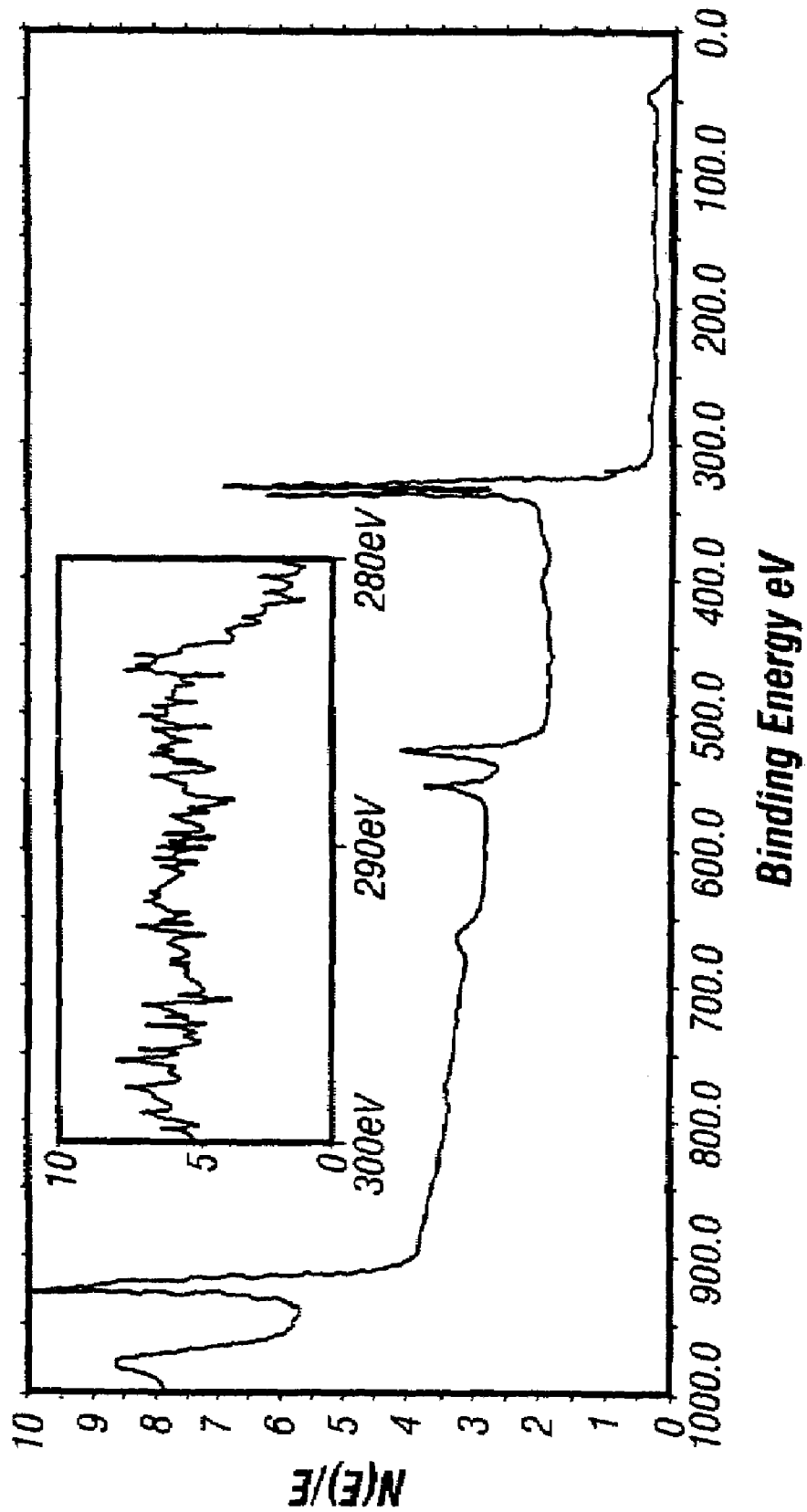
FIG. 2B is an XPS survey spectra (75° take-off angle) of a palladium film deposited on a silicon wafer using CFD. Results are shown after sputter cleaning with $Ar^+$ ions to remove atmospheric contamination. The inset is an expansion of the $C_{1s}$ region of the spectra.

FIG. 2B shows an XPS survey spectrum taken after sputter cleaning with Ar$^+$ ions to remove atmospheric contaminates. There were no peaks detected in the $C_{1s}$ carbon region (280–290 eV) of the sputtered deposit. The inset in FIG. 2B is an expansion of the XPS spectra in the 280 eV to 300 eV region, which contains the $C_{1s}$ region. Fluorine photoelectron lines ($F1_s=686$ eV) were not observed indicating no contamination by the ligand or ligand-derived decomposition products. Pd photoelectron lines are observed at the following binding energies (Mg source): $4p_3=54$ eV, $4s=88$ eV, $3d_5=337$ eV, $3d_3=342$ eV, $3p_3=534$ eV, $3p_1=561$ eV, and $4s=673$ eV. Auger lines are observed at 928 eV and 979 eV. Additional experiments at similar conditions (e.g., 0.59 wt % Pd(hfac)$_2$, 80° C., 156 bar, 2 hours) yielded similar results.

5) Palladium Thin Film from Supercritical Ethane

A palladium thin film is deposited onto a silicon wafer by reduction of palladium(II) bis(2,2,7-trimethyl-3,5-octanedionate) (Pd(tod)$_2$) with H$_2$ in supercritical ethane solvent. With the exception of the precursor, Pd(tod)$_2$, and the solvent, ethane, the procedure is similar to the one in Example 1. Temperature is set between 32° C. and 100° C., pressure is set between 75 and 500 bar, and the supercritical Pd(tod)$_2$ solution concentration is set between 0.01% and 1.0% by weight.

6) Copper Thin Film on a Silicon Wafer

Figure 3B:
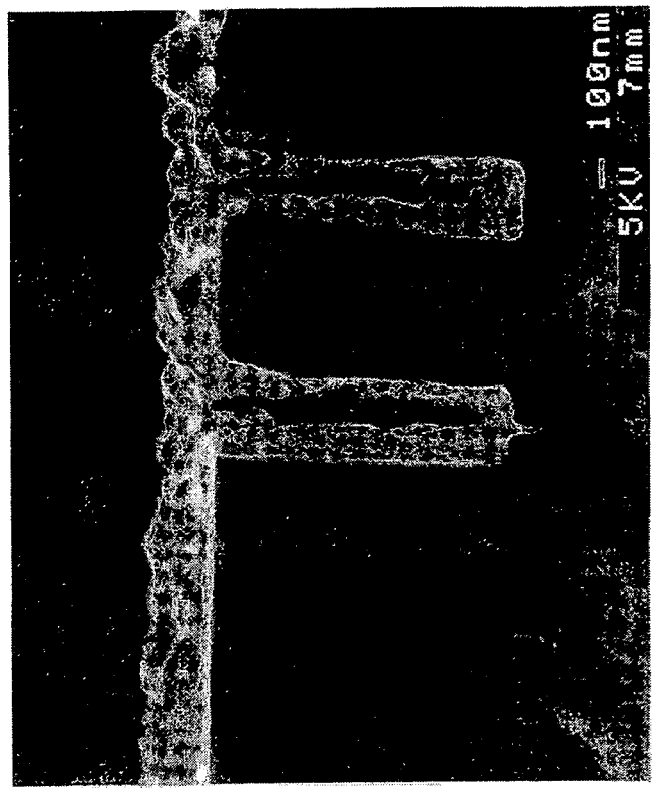
FIGS. 3A and 3B are SEM micrographs of copper films grown on palladium seeded, patterned silicon wafers using bis(2,2,6,6-tetramethyl 3,5-heptanedionato) copper(II) (Cu (TMHD)$_2$) in a hot-wall reactor. All features are approximately 1 $\mu$m deep.
Figure 3A:
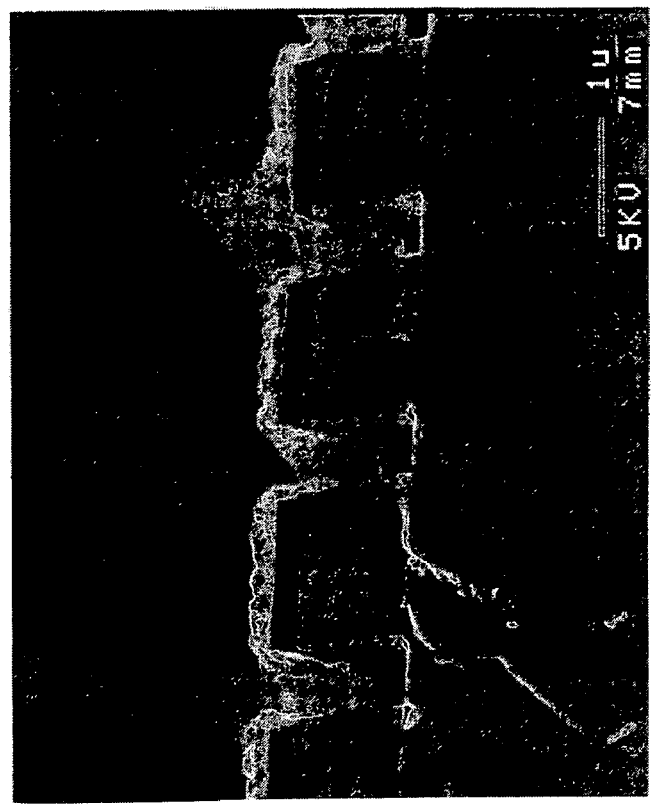

A copper thin film was deposited onto a silicon wafer using a two-step process. A patterned Si wafer was cleaned by sonication in acetone and methanol and dried in a convection oven. A palladium seed layer was then deposited onto the patterned Si wafer by hydrogen reduction of a 0.1 wt % solution of π-2-methylallyl(cyclopentadienyl) palladium(II) in CO$_2$ at 60° C. and 138 bar using a procedure similar to that described in Examples 1 and 2. A conformal copper film was then deposited onto the seeded substrate by the hydrogen reduction of a 0.6 wt % solution of bis(2,2,6,6-tetramethyl 3,5-heptanedionato)copper(II) (Cu(TMHD)$_2$) in CO$_2$ solution at 120° C. and 276 bar. FIGS. 3A and 3B are SEM images of a cross-section of the fractured wafer after deposition of the film. It is evident that the deposited film is conformal to the wafer surface. Analysis of the film by x-ray diffraction revealed characteristic reflections for the (111) and (200) crystal planes of Cu.

7) Metal Sulfide Thin Film on a Silicon Wafer

A metal sulfide (e.g., CdS, PbS, and ZnS) film is deposited onto a silicon wafer by the reaction of the reaction reagent H$_2$S with a suitable alkyl, allyl, or beta-ketonate metal complex, for example reduction of bis(allyl)zinc with H$_2$S to yield ZnS. The procedure is similar to the one performed in Example 1 with the exception of the precursor, bis(allyl)zinc, and the reaction reagent, H$_2$S. The temperature is set between 32° C. and 100° C., the pressure is set between 75 and 500 bar, and the supercritical bis(allyl)zinc solution concentration is set between 0.01 and 1.0 percent by weight.

8. Mixed Metal Thin Film of Y—Ba—Cu

A mixed metal film of Y—Ba—Cu is deposited onto a silicon wafer by dissolving metal beta-diketonates of Y, Ba, and Cu, such as Y(thd)$_3$, Ba(thd)$_3$, and Cu(thd)$_3$, into supercritical ethane to form a solution with a stoichiometric ratio of 1Y:2Ba:3Cu. $H_2$ gas is used as a reducing agent to decompose the precursors into elemental metal on the substrate surface. The procedure is similar to the one performed in Example 1 with the exception of different precursors (i.e., metal beta-diketonates) and a different supercritical solvent (i.e., ethane). Temperature is set between 32° C. and 100° C., pressure is set between 75 and 500 bar, and the supercritical solution concentration for each of the different metals is set between 0.01 and 1.0 percent by weight.

Subsequent to forming the mixed metal film by CFD, the mixed metal film can be oxidized using standard techniques, for example by an oxygen plasma, to give a superconducting thin film of $YBa_2Cu_3O_{7-x}$, (e.g., see Sievers et al U.S. Pat. No. 4,970,093).

9. Thin Film Metal Alloys of Platinum and Nickel

Figure 3C:
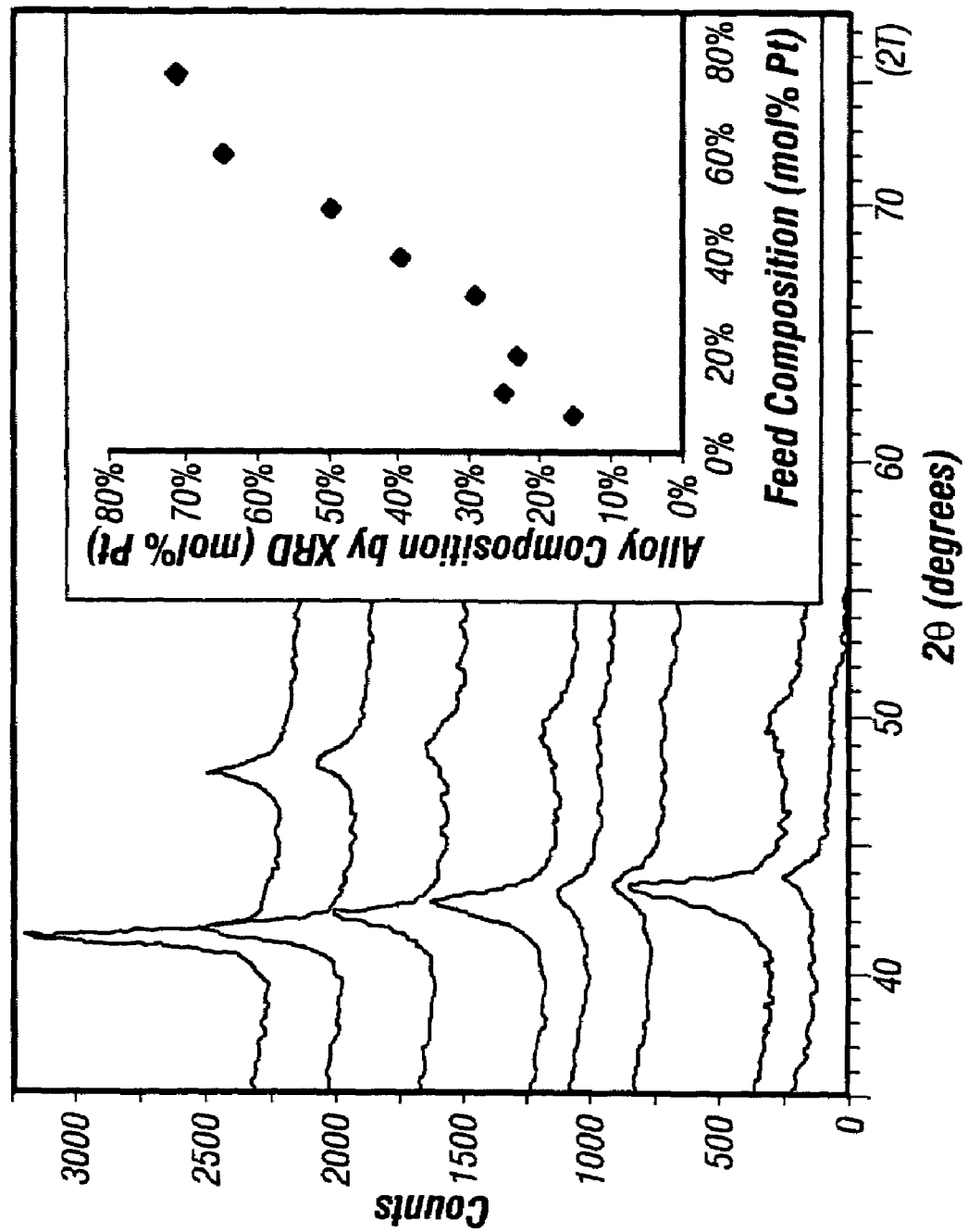
FIG. 3C is X-ray diffraction data for thin films of Ni/Pt alloys. The inset is a plot of the alloy composition determined from the x-ray data versus the feed composition for the metal precursors.

CFD was used to deposit thin films of Ni/Pt alloys of increasing Ni composition spanning the composition range between the two elements. Bis(cyclopentadienyl)nickel ($Cp_2Ni$) and dimethyl(cyclooctadienyl) platinum ($CODPtMe_2$) were used as the metal precursors. Hydrogenolysis of cosolutions of these compounds at 60° C. and 140 bar yielded the Ni/Pt alloys. The composition of the alloy was dictated by the stoichiometric ratio of the precursors in supercritical $CO_2$ solution. X-ray diffraction (XRD) was used to determine the alloy composition in the films. FIG. 3C shows the x-ray data for each of the films. In each case, the X-ray data displays a single diffraction peak between the x-ray diffraction angle 2θ≈40° (corresponding to pure Pt (111)) and the x-ray diffraction angle 2θ≈45° (corresponding to pure Ni (111)), corresponding to the formation of a homogeneous mixture with no evidence of pure regions of either parent metal. Furthermore, the regular shift in the 2θ values of the peaks signifies the formation of a continuous series of alloys. The inset in FIG. 3C shows alloy composition determined from the x-ray data versus the feed composition for the metal precursors and reveals a near 1:1 correspondence between alloy composition and fluid phase composition.

10. Conformal Films of Palladium on Patterned Si Wafers, Polyimide, and γ-Alumina High purity palladium films were deposited onto patterned and unpatterned Si wafers, polyimide (Kapton®; DuPont), and γ-alumina by the reduction of organopalladium compounds in supercritical $CO_2$ solution using a batch process at temperatures between 40 and 80° C. and pressures between 100 and 140 bar. Table 2 below lists the films produced.

TABLE 2

| Complex | T (° C.) | P (bar) | OM wt. %[a] | Substrate | Adhesion[b]/Comments |
|---|---|---|---|---|---|
| $Pd(hfac)_2$ | 60 | 103 | 0.37 | Kapton | Bright metallic film; fair adhesion |
| $Pd(hfac)_2$ | 60 | 124 | 0.28 | Kapton | Bright metallic film; fair adhesion |
| $Pd(hfac)_2$ | 80 | 138 | 0.29 | Kapton | Metallic film; fluid phase nucleation; poor adhesion |
| $Pd(hfac)_2$ | 60 | 124 | 0.30 | Ti/W—Si[c] | Metallic film; poor adhesion |
| $(\pi^3-C_3H_5)Pd(acac)$ | 40 | 103 | 0.38 | Silicon | Bright metallic film; poor adhesion |
| $(\pi^3-C_3H_5)Pd(acac)$ | 40 | 103 | 0.25 | Kapton | Nonuniform bright metallic film |
| $(\pi^3-C_3H_5)Pd(acac)$ | 60 | 103 | 0.24 | Kapton | Bright metallic film; good adhesion |
| $(\pi^3-C_3H_5)Pd(acac)$[d] | 40 | 138 | 0.18 | Kapton | Metallic film; good adhesion |
| $(\pi^3-C_3H_5)Pd(acac)$[d] | 40 | 138 | 0.18 | γ-Alumina | Dull gray metallic film; good adhesion |
| $(\pi^3-C_3H_5)Pd(acac)$[d] | 40 | 138 | 0.36 | Kapton | Dark gray metallic |
| $(\pi^3-C_3H_5)Pd(acac)$[d] | 40 | 138 | 0.36 | γ-Alumina | Dark gray metallic |
| $CpPd(\pi^3-C_4H_7)$ | 60 | 103 | 0.41 | Kapton | Bright metallic film; poor adhesion; fluid phase nucleation |
| $CpPd(\pi^3-C_4H_7)$ | 60 | 103 | 0.21 | Kapton | Metallic film |
| $CpPd(\pi^3-C_4H_7)$ | 60 | 138 | 0.21 | Kapton | Bright metallic film; fluid phase nucleation |
| $CpPd(\pi^3-C_4H_7)$ | 60 | 138 | 0.24 | Kapton | Bright metallic film; fluid phase nucleation |
| $CpPd(\pi^3-C_4H_7)$ | 60 | 138 | 0.26 | Patterned Silicon | Bright metallic film |

In Table 2, superscript "a" denotes weight percent calculated by weight of organometallic (OM) divided by weight of $CO_2$ added. Superscript "b" indicates that an explanation of adhesion is described below. Superscript "c" denotes that the Si wafer was sputtered with ~7 nm of 88% Ti/12% W. Superscript "d" denotes that the depositions were performed thermally without hydrogen addition. The precursor synthesis and deposition are described in greater detail below.

Allylpalladium chloride dimer, palladium (II) chloride, and cyclopentadienylthallium (99% sublimed) were purchased from Strem Chemicals. Sodium acetylacetonate monohydrate, 3-chloro-2-methylpropene (2-methylallyl chloride), and palladium(II) hexafluoroacetylacetonate, $Pd(hfac)_2$, were purchased from Aldrich Chemical Co. Each was used as received. Precursor synthesis was carried out under inert atmospheres of purified argon using standard Schlenk techniques. Transfer of air sensitive reagents during synthesis and loading of high-pressure reaction vessels with palladium precursors was conducted inside a glove box that had been purged for 30 minutes with pre-purified nitrogen. All solvents used for air or moisture sensitive reactions were dried over sodium and benzophenone ketyl, then distilled under an atmosphere of purified argon.

π-allylpalladium acetylacetonate, $(\pi^3-C_3H_5)Pd(acac)$, was synthesized using standard procedures immediately prior to use. See, e.g., S. Imamura et al. in *J. Bulletin of the Chemical Society of Japan* (42:805–808, 1968). $(\pi^3-C_3H_5)$ Pd(acac) was found to be pure by proton NMR. $^1H$ NMR: 200 MHz in $CDCl_3$, 2.01 ppm (s, 6H, $CH_3$ acac), 2.90 ppm (d, $J_{H-H}$=11.9 Hz, 2H, anti-H of $CH_2$), 3.88 ppm (d, $J_{H-H}$=6.8 Hz, 2H, syn-H of $CH_2$), 5.39 ppm (s, 1H, C—H acac), 5.57 ppm (triplet of triplets, 1H, C—H allyl). 2-Methylallyl palladium chloride dimer was prepared according to standard literature procedures and stored cold under argon. See, e.g., M. Sakakibara et al. in *Y. Chemical Communications* (1969–1970, 1969). $[(\pi^3-C_4H_7)PdCl]_2$ was found to be pure by proton NMR. $^1H$ NMR: 200 MHz in $CDCl_3$, 2.15 ppm (s, 3H, $CH_3$), 2.89 ppm (s, 2H, anti-H of $CH_2$), 3.87 ppm (s, 2H, syn-H of $CH_2$).

2-Methylallylpalladium cyclopentadienylide, $CpPd(\pi^3-C_4H_7)$, was synthesized from $[(\pi^3-C_4H_7)PdCl]_2$ and cyclopentadienythallium. In a standard preparation, 2.63 g (6.676 mmol) of $[(\pi^3-C_4H_7)PdCl]_2$ and two equivalents (3.60 g, 13.35 mmol) of cyclopentadienythallium were sealed together in a Schlenk flask under an atmosphere of nitrogen. The flask was then transferred to a Schlenk line where its nitrogen atmosphere was replaced with purified argon. The flask was cooled to −78° C. and 70 ml of tetrahydrofuran, previously dried from sodium and benzophenone ketyl, was condensed onto the reagents. With constant stirring, the reaction was warmed overnight to room temperature whereupon the mixture consisted of a dark red THF solution and an off-white precipitate. The solution was filtered under a stream of argon to remove the insoluble thallium chloride. The clear red filtrate was reduced in volume under vacuum until a dark-red crystalline material remained. This material was easily sublimed (60° C. at 0.2 torr) to remove trace impurities, yielding long dark-red needles of CpPd($\pi^3$-$C_4H_7$). Yield 2.12 g, 70%. The product was sublimed again prior to each deposition reaction and found to be pure by proton NMR. $^1$H NMR: 200 MHz in $d_6$-benzene, 1.69 ppm (s, 3H, $CH_3$), 2.12 ppm (s, 2H, anti-H of $CH_2$), 3.39 ppm (s, 2H, syn-H of $CH_2$), 5.86 ppm (s, 5H, $C_5H_5$).

Boron-doped, P-type silicon test wafers with a <100> orientation were obtained from International Wafer Service. Etched Si test wafers were obtained from Novellus Systems. All wafers were cleaned by immersion in boiling deionized water, followed by rinsing and sonication in acetone or methyl alcohol for 20 minutes. The wafers were then dried overnight in air at 100° C. Sheets of Kapton® polyimide (Dupont) of 50 μm thickness were cleaned using a similar procedure. γ-alumina substrates were prepared from porous α-alumina disks prepared by the compression of α-alumina powder in a mechanical press followed by heating at 1200° C. for a period of 30 hours. The resulting pressed disks were then coated with a thin layer of γ-alumina by the sol-gel process using a 1-M boehmite sol doped with polyvinyl alcohol. Carbon dioxide (Coleman grade) and hydrogen (High Purity grade) were obtained from Merriam-Graves and used as received.

All depositions from $CO_2$ were conducted in high-pressure stainless steel reactors (High Pressure Equipment Company) with an approximate volume of 17 ml. A single substrate (~1 by 4 cm samples of silicon wafer or ~1 by 7 cm samples Kapton polyimide) and a known amount (10–40 mg) of precursor were added to the vessel. Pd(hfac)$_2$ was loaded at ambient conditions. The precursor ($\pi^3$-$C_3H_5$)Pd (acac) decomposes slowly in air at room temperature and was therefore loaded under a stream of argon or inside a nitrogen glove box. CpPd($\pi^3$-$C_4H_7$) is stable for short periods of time in the atmosphere, but was loaded in the dry box as a precaution. The vessels were sealed with a plug at one end and a high-pressure needle valve at the other. The vessels were purged with $CO_2$, weighed, and placed in a circulating constant temperature bath (40–80° C.) and allowed to equilibrate to the desired temperature. Carbon dioxide was then added to the desired pressure via a high-pressure manifold or a high-pressure syringe pump (Isco, Inc. Model 260D) that was maintained at the same temperature as the constant temperature bath. The vessels were mixed with a vortex mixer or by cyclic inversion and weighed to determine the mass of $CO_2$ added. The vessels were then returned to the constant temperature bath for 1 hour to ensure complete dissolution of the precursor.

Film deposition was initiated by reduction of the precursor either thermally or upon reaction with hydrogen using the CFD methods. For hydrogenolysis, a 60–100 fold molar excess of $H_2$ was transferred to the reaction vessel via a small pressurized manifold (3.6 ml), consisting of a section of high pressure tubing capped at both ends with high pressure needle valves and equipped with a pressure gauge. The quantity of hydrogen admitted into the vessel was calculated by the pressure-drop measured in the manifold. The rate of hydrogen addition was regulated using a needle valve at approximately 200 μmols per minute. After hydrogen addition, the reactions were allowed to stand for a period of 1–2 hours, although kinetic experiments indicate the reaction is complete in less than 2 minutes for CpPd($\pi^3$-$C_4H_7$). View cell experiments suggested a similar reaction period for Pd(hfac)$_2$. The vessels were then depressurized and the effluent directed through an activated charcoal bed. In some cases, the reaction by-products contained in the $CO_2$ mixture were first collected for analysis by venting the vessel through an appropriate solvent.

Solubility of the precursors in $CO_2$ at the deposition conditions was verified optically using a variable volume view cell. X-ray photoelectron spectroscopy (XPS) was conducted using a Perkin-Elmer Physical Electronics 5100 spectrometer with Mg $K\alpha$ excitation (400 W 15.0 kV). To ensure representative analysis, a sampling area of 4×10 mm was employed. The films were cleaned by Ar+ sputtering to remove atmospheric contaminants until the measured atomic concentrations in consecutive analyses were invariant. Field emission scanning electron microscopy (FE-SEM) was performed using a JEOL 6400 FXV SEM and an accelerating voltage of 5–10 kV. Analysis of cross-sections of Pd films on polyimide was conducted after embedding in epoxy and subsequent cryo-microtomy. Wide-angle x-ray diffraction (WAXD) was performed on a Phillips X'Pert PW 3040 with Cu $K_\alpha$ radiation.

As indicated in Table 2, palladium was deposited onto the substrates by hydrogenolysis of the precursor or by thermal decomposition for some of the ($\pi^3$-$C_3H_5$)Pd(acac) precursors at 40–80° C. Pressures were between 100 and 140 bar and precursor concentrations in $CO_2$ ranged from 0.2 to 0.6 wt. %. A 60–100 fold molar excess of $H_2$ was used for each hydrogenation. The resulting films were analyzed by x-ray photoelectron spectroscopy (XPS), scanning electron microscopy (SEM) and wide-angle x-ray diffraction (WAXD). The XPS survey of the palladium films indicated that subsequent Ar$^+$ sputtering removed atmospheric contaminants, with any carbon impurities being below the detection limits of the instrument. Fluorine contamination (600 eV and 688 eV) was not observed in any of the films deposited from Pd(hfac)$_2$ suggesting that ligand-derived contamination does not occur.

The morphology of palladium films grown on polyimide was studied using SEM. The film deposited from Pd(hfac)$_2$ contains grains of approximately 10 nm in size. The film deposited from CpPd($\pi^3$-$C_4H_7$) consists of well-defined palladium grains of ~30–70 nm in diameter. This near order of magnitude increase in grain size using CpPd($\pi^3$-$C_4H_7$) as the precursor relative to films deposited from Pd(hfac)$_2$ was typical under these deposition conditions. SEM analysis of the polymer/Pd film cross-sections revealed Pd was not deposited within the substrate. The polycrystalline nature of the metal film was verified by WAXD, which revealed only the broad Pd 111, 200, and 220 reflections in locations consistent with the small primary grain sizes observed by SEM. Films deposited onto polyimide from Pd(hfac)$_2$ and CpPd($\pi^3$-$C_4H_7$) were ~100 nm to 200 nm thick, as calculated by mass gain and confirmed by analysis of film cross-sections by SEM. The initial loading of the precursor dictates film thickness in these batch experiments. Thicker films can be grown by sequential batch deposition cycles. While the solubility of both precursors readily exceeds 1 wt. % at 60° C. and 138 bar, operation at concentrations above 1 wt. % may lead to gas phase nucleation and deposition of Pd particulates. Gas phase nucleation was also observed upon rapid addition of excess $H_2$ at all precursor concentrations and was mitigated by limiting the rate of $H_2$ addition to less than 200 μmols/min using a needle valve.

$(\pi^3\text{-}C_3H_5)Pd(acac)$ decomposes relatively slowly at room temperature (for the purposes of these methods) and was chosen as a candidate precursor for low temperature thermal decompositions from $CO_2$ solution. Thermolysis of $(\pi^3\text{-}C_3H_5)Pd(acac)$ in neat $CO_2$ at 40° C., yielded dark, poorly reflective films. XPS analysis confirmed extensive carbon contamination (~8 wt. %). SEM analysis revealed inhomogeneous films with distinct regions of large globular metallic clusters greater than 100 nm in diameter and regions containing particles with a broad size distribution. Carbon contamination was reduced by the addition of hydrogen using the CFD methods. XPS analysis revealed films deposited in this manner are free of oxygen contamination and carbon contamination is less than 5%.

Reduction of deep red solutions of $CpPd(\pi^3\text{-}C_4H_7)$ in supercritical $CO_2$ within a variable volume view cell proceeded immediately upon addition of $H_2$ as evidenced by the immediate loss of all color in the cell and the formation of a metallic film on the quartz window. Nuclear magnetic resonance spectroscopy (NMR) was used to analyze the products of $CpPd(\pi^3\text{-}C_4H_7)$ hydrogenolysis in $CO_2$. Samples of the reaction products were obtained by passing the effluent gases from completed depositions in a standard reaction vessel through either deuterated acetone or chloroform (3–4 grams). Complete reduction of all ligands under these conditions was confirmed by the observation of a singlet at 1.5 ppm and a doublet at 0.87 ppm corresponding to the protons in cyclopentane and the methyl groups in isobutane (2-methylpropane), respectively. The remaining proton of isobutane $[(CH_3)_3\text{—C—H}]$ overlapped with a signal attributed to the solvent. An additional signal, appearing as a singlet, was observed at 2.86 ppm and is attributed to dissolved hydrogen. This was confirmed by analysis of $H_2$—saturated d-acetone solutions. No additional proton signals were observed, confirming complete reduction of all double bonds of the cyclopentadienyl and allyl ligands to their alkane analogs.

$^1$H NMR was also used to confirm that the reduction of $CpPd(\pi^3\text{-}C_4H_7)$ in $CO_2$ upon $H_2$ addition is rapid at the conditions used in these depositions. Hydrogenation was monitored by removing small aliquots of the reaction media at regular time intervals following introduction of $H_2$ to the solution of $CO_2$ and $CpPd(\pi^3\text{-}C_4H_7)$. NMR analysis of the effluent indicated that the precursor was completely consumed within the first two minutes of the reaction: all resonances assigned to $CpPd(\pi^3\text{-}C_4H_7)$ are absent and replaced by the signals from cyclopentane, isobutane, hydrogen, and only trace amounts of unidentified, unsaturated species. Analysis of a second aliquot, taken from the reaction 22 minutes after $H_2$ addition, indicated complete hydrogenation of the trace, unsaturated products. The third, and all subsequent aliquots taken after 42 minutes, revealed the peaks are invariant with additional reaction time. These results were consistent with observations in the view cell that suggest an induction period for the reaction is not present.

The products from the hydrogenolysis of $(\pi^3\text{-}C_3H_5)Pd(acac)$ at 40° C. and 103 bar and thermolysis at 40° C. and 103 bar were also analyzed. Visible at 0.810 ppm and 1.51 ppm are the predicted proton resonances characteristic of propane, resulting from the hydrogenolysis of the bound allyl group, which appear as the expected triplet and multiplet respectively. An additional set of resonances was also observed at 1.05 ppm (d), 1.94 ppm (mult.), 2.95 ppm (br. s), and 4.06 ppm (mult.) and matches those of 2,4-pentanediol $(C_5H_{12}O_2)$ (Scheme 2). A third, unidentified minor product was observed between 1.6 and 1.9 ppm. This species is the only ligand product observed when deposition was performed thermally, in particular, the proton resonances corresponding to propane and 2,4-pentanediol evident upon the hydrogenolysis of $(\pi^3\text{-}C_3H_5)Pd(acac)$ were not observed when this precursor was decomposed thermally. The ligand product is presumed to be the result of decomposition via reductive elimination prior to the introduction of $H_2$. Finally, unreacted $(\pi^3\text{-}C_3H_5)Pd(acac)$ or the presence of 2,4-pentanedione $(C_5H_8O_2)$ was not detected in either method of palladium deposition.

Figure 4A:
FIGS. 4A–4D are SEM micrographs of palladium films grown on patterned Si wafers using a 0.26 wt. % solution of CpPd($\pi^3$-$C_4H_7$) in $CO_2$ at 138 bar and 60° C. All features are approximately 1 $\mu$m deep with the widths of the etched features as follows: (4A and B) 0.12 $\mu$m, (4C) 0.7 $\mu$m and (4D) 0.3 $\mu$m (measured at ½ the trench height).
Figure 4B:
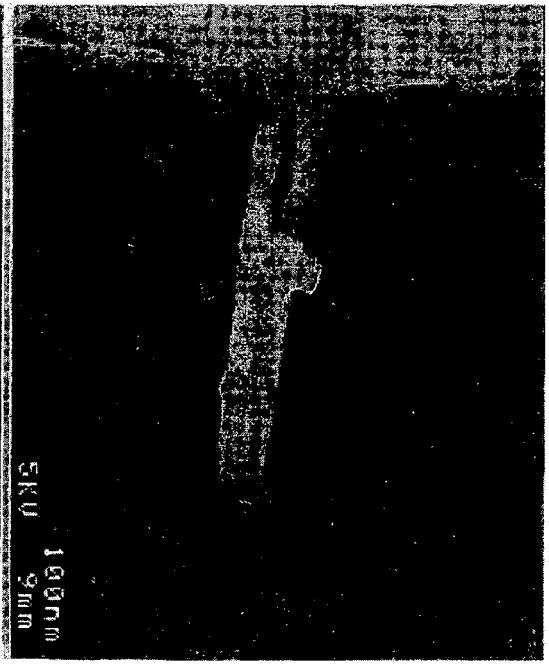
Figure 4C:
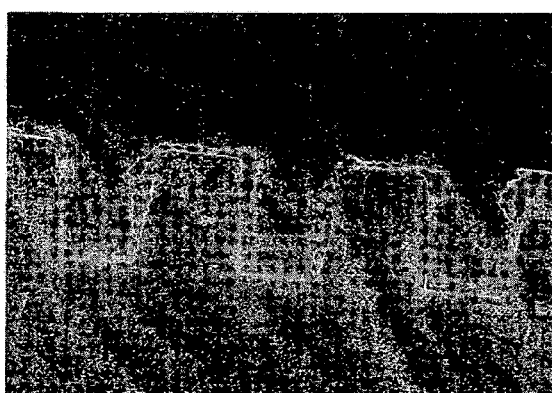
Figure 4D:
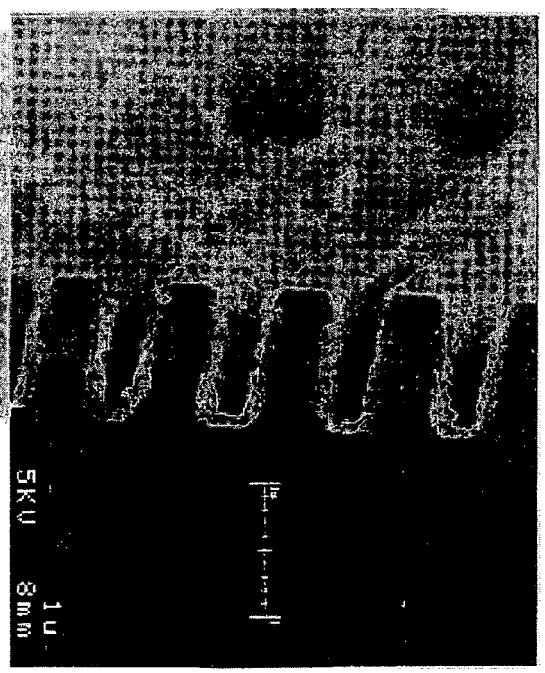
Figure 5B:
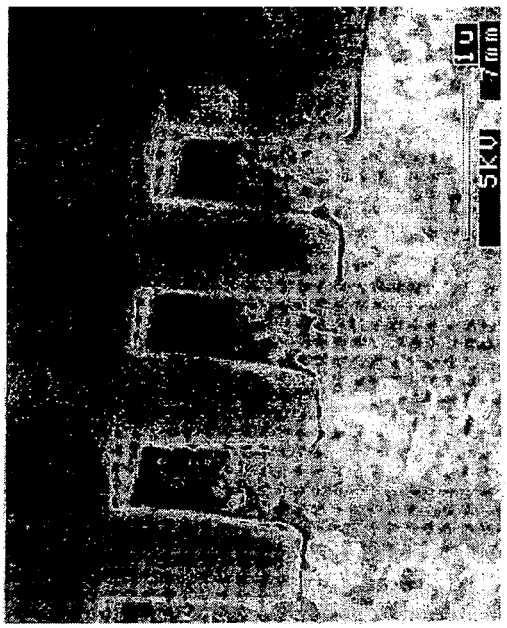
FIGS. 5A–5D are additional SEM micrographs of conformal trench filling by CFD. In particular, the FSEM micrographs show nickel films deposited onto Pd seeded, etched Si wafers by hydrogen reduction of bis(cyclopentadienyl)nickel (NiCp$_2$) in $CO_2$ in either (5A) a batch reactor at 140 bar and 60° C., or (5B–5D) a continuous-flow reactor at 60° C. and 180 bar. Ni film conformality and cohesion is evident in the thick film that has delaminated from the substrate during wafer fracture prior to analysis.
Figure 5D:
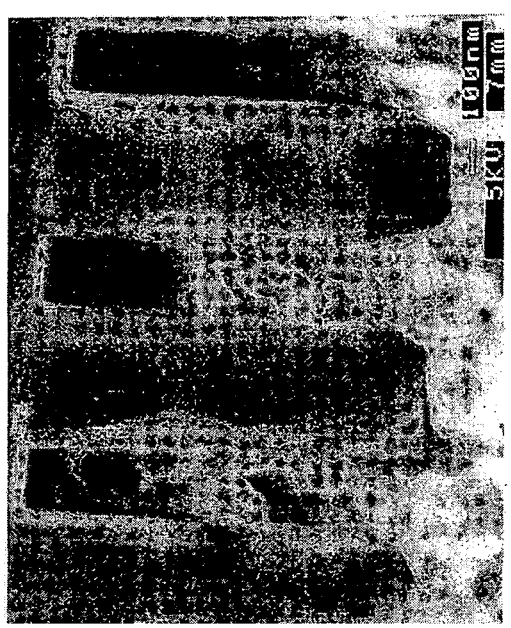
Figure 5A:
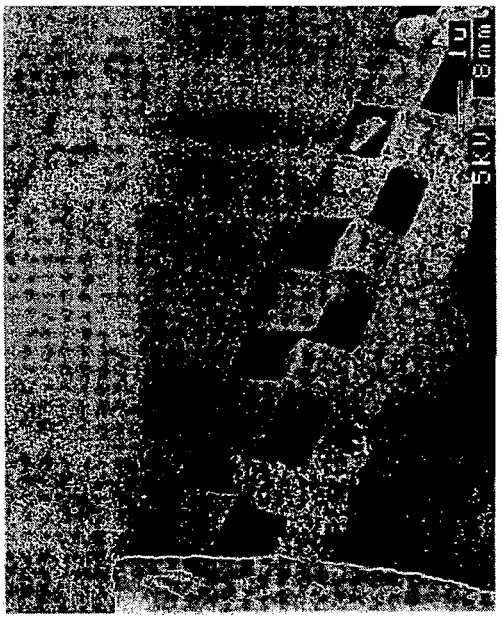
Figure 5C:
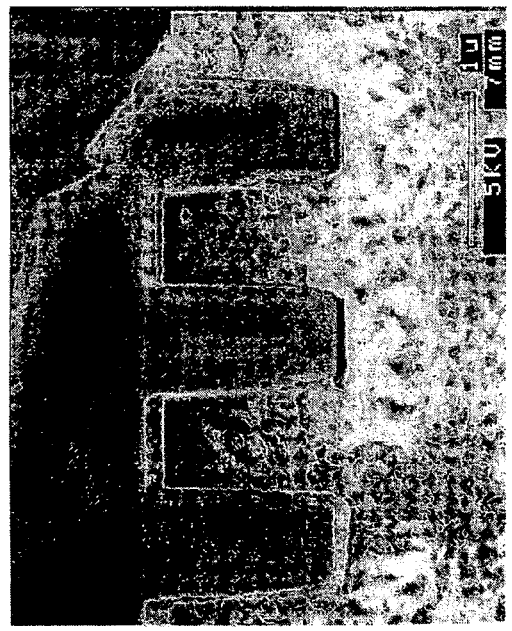

Conformal deposition of continuous, pure palladium films onto silicon test wafers with features as small as 0.1 μm wide by 1 μm high was observed using the precursor $CpPd(\pi^3\text{-}C_4H_7)$ via batch CFD at 138 bar and 60° C. Cross-sections of the films were prepared for SEM analysis by scoring the reverse of the wafers and then fracturing carefully by hand. Images of representative regions are shown in FIGS. 4A–D. FIGS. 4A and 4B illustrate the smallest of these features with dimensions between 100–120 nm in width by 1 μm deep. FIGS. 4C and 4D illustrate larger features with dimensions of 0.7 μm wide (4c) and 0.3 μm wide (4d) by 1 μm deep. Palladium deposition was found to be conformal to all surface features forming a thin layer of metal that exactly matched the topography of the wafer, including the corners at the bottom of etched features. Conformal coverage was maintained in the high aspect ratio features (0.1 μm wide by 1 μm deep) in which the opposing layers of palladium metal on either side of the feature nearly join.

The small space in FIG. 4B at the bottom of the feature is due to lifting of the metal film from the $SiO_2$ surface during wafer fracture. Within the larger features, the thickness of the film is approximately 100 nm and is uniform along the sides and bottom of each trench. No excess buildup of palladium was observed on the top of the features, which suggests that any seams in the nearly filled narrow trenches could be filled completely by subsequent batch depositions or by deposition in a continuous flow reactor.

FIGS. 5A to 5D show additional SEM micrographs of conformal trench filling by CFD. The deposition of conformal thin palladium films, which are evenly distributed over all areas of the topologically complex surface, could also serve as a seed layer for subsequent electrolytic deposition of other metals.

11. Two-Step Process of Applying a Palladium Seed Layer and Copper Plating

One two-step process involves a first CFD step to deposit a palladium seed layer on a silicon wafer, followed by an electroless copper bath to plate the seeded substrate.

Silicon Wafer Preparation: Patterned silicon wafers measuring roughly 1 cm×1.5 cm were cleaned as follows: 1) Rinse under flowing tetrahydrofuran; 2) Rinse under flowing Reverse Osmosis (R.O.) $H_2O$; 3) Boil ~1 hour in 37% HCl; 4) Boil ~2 hours in R.O. $H_2O$; and 5) Sonicate in warm THF for 30 minutes. Silicon substrates were then transferred to a convection oven at 325° F. for roughly one hour prior to transfer to a $N_2$ atmosphere glovebox.

Palladium Seed Layer Deposition: Under a $N_2$ atmosphere, wafers were loaded into a 20 ml high pressure reactor along with 8 mg p-methylallylcyclo-pentadienyl Palladium (II) [sublimed <48 hours prior] and the vessel was sealed before removal from the inert atmosphere. The reactor was pressurized to 2000 psi with $CO_2$ at 60° C. and soaked for 20 minutes. $H_2$ was injected into the reactor via a pressure drop from 3000 to 2600 psi on a 3.8 ml high-pressure manifold over roughly 3 minutes. The vessel was allowed to soak for an additional 60 minutes prior to depressurization through an activated charcoal filter. Substrates were transferred directly from the reactor vessel to a prepared MacDermid M-Copper 85 Electroless copper bath.

Figure 6A:
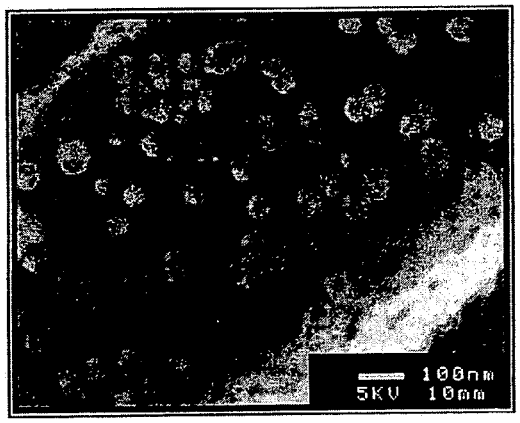
FIG. 6A is a SEM micrograph of a seed layer of palladium clusters on a silicon wafer.
Figure 6B:
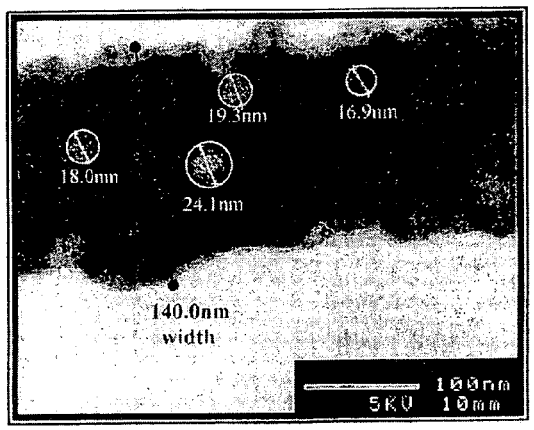
FIG. 6B is a SEM micrograph of a close-up view of the micrograph in FIG. 6A, showing several palladium clusters within a trench only 140 nm wide.

As shown in FIG. 6A, palladium clusters formed on the substrate. FIG. 6B shows a close-up view, in which the seed clusters are present within a trench only 140 nm wide. The clusters are between about 17.0 and 24 nm in diameter.

Electroless Copper Bath Preparation and Copper Deposition: The bath used was a MacDermid, Inc., M-Copper 85 Electroless Copper Bath (Product Code Number: 12440). The electroless copper bath was prepared on a 200 ml total bath volume scale according to manufacturer's instructions and as follows. 165 ml of R.O. $H_2O$ was added to a 250 ml Pyrex recrystallizing dish. The water was stirred with a magnetic TEFLON® stir bar and continuously sparged with $N_2$ through a 1 μM pore size fritted glass filter. The water was heated to 45° C.±~0.5° C. with a heating mantle prior to addition of other bath constituents. Bath components were added in the following sequence with rapid agitation and $N_2$ sparging:

| Bath Component | Volume |
|---|---|
| Solution B - EDTA Complex | 20 ml |
| Solution A - CuSO4(aq) [300 g/L] | 8.0 ml |
| Solution D (provided by manufacturer) | 3.0 ml |
| Solution G (provided by manufacturer) | 0.2 ml |
| 37% Formaldehyde | 0.5 ml |

Figure 7A:
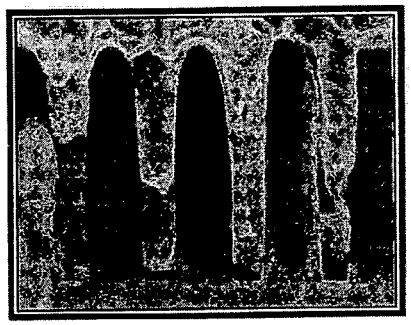
FIGS. 7A and 7B are SEM micrographs showing copper deposition within trenches on a substrate that are 165 nm wide by 1100 nm deep (7A) within a trench that is 235 nm wide by 600 nm deep (7B) by a two step process consisting of deposition of a Pd seed layer using CFD followed by electroless deposition.
Figure 7B:
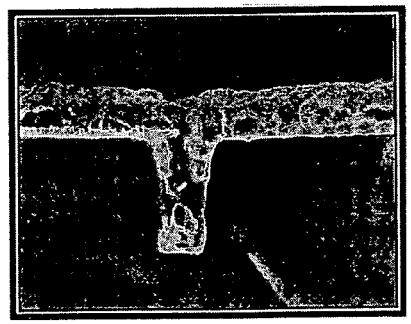

Palladium seeded Si substrates were transferred directly from the high-pressure vessel to the electroless bath with a total atmospheric exposure of less than one minute. Substrates were immersed in the plating solution for 7, 10, and 20 minutes. Each of the substrates was removed in sequence from the plating solution, washed under flowing R.O. $H_2O$ and directly transferred to a vacuum dessicator. All films display a bright, shiny metallic copper film that did not oxidize in the vacuum dessicator. As shown in FIGS. 7A and 7B copper deposition proceeds readily within, and fills high aspect ratio trenches in, the etched Si wafers. FIG. 7A shows Cu deposition within trenches that are 165 nm wide by 1100 nm deep. FIG. 7B shows Cu deposition within a trench that is 235 nm wide by 600 nm deep.

12. Two-Step Process of Applying a Platinum Seed Layer and Copper Plating

Another two-step process involves a first CFD step to deposit a palladium seed layer on a silicon wafer, followed by an electroless copper bath to plate the seeded substrate.

Silicon Wafer Preparation: Patterned silicon wafers measuring roughly 1 cm×1.5 cm are cleaned as described in Example 11. Silicon substrates are then transferred to a convection oven at 325° F. for roughly 1 hour. The clean and dry silicon wafers are transferred to a hot nitric acid bath (150 ml concentrated nitric acid/50 ml R.O. $H_2O$). The substrates are soaked in the acid bath for ~4 hours, rinsed with flowing R.O. $H_2O$, and then transferred to a boiling R.O. $H_2O$ bath for an additional 2 hours. Substrates are immediately transferred from the water bath to test tubes for storage in a vacuum dessicator until use.

Silicon Wafer Functionalization: Silicon substrates oxidized as previously mentioned are covered with roughly 20 ml of a wet toluene solution. The toluene solution is prepared by addition of 1.00 ml R.O. $H_2O$ to a 500 ml of stock toluene. The test tubes are capped with aluminum foil and test tube vial screw caps. Transfer of wet toluene and soaking is performed with exposure to ambient conditions.

After ~24 hours of soaking in the wet toluene solution, the Si sample test tubes are transferred to a $N_2$ atmosphere glovebox. Substrates are transferred to clean, dry 20 ml screw cap test tubes where 15.0 ml of distilled, dry toluene is added. To each test tube, 3.75 ml of 4-[2-(trichlorosilyl) ethyl]pyridine is added to produce a solution. The same volumetric ratio of 4 parts dry toluene:1 part coupling agent is used for various silane coupling agents. The optimal ratio and reaction times are highly dependent upon the coupling agent reactivities. The coupling agents can include: 2-[tri-methoxy-silylethyl]pyridine; 3,3,3-trifluoropropyltrichlorosilane; 3-iodopropyltrimethoxysilane; and 4-(3-triethoxysilylpropyl)-4,5-dihydroimidazole chlorotrimethoxysilane.

Reaction test tubes are capped with aluminum foil and test tube screw caps. A soaking period of between 24 and 72 hours is permitted for the reaction of the coupling agent with the substrate. After this time and still under an inert atmosphere, the substrates are removed from the coupling agent solution and washed with two 20 ml volumes of stock toluene. Samples are then removed from the glove box under a stock toluene solution in capped test tubes and are washed with two 20 ml volumes of anhydrous methanol. The functionalized wafers are then immediately transferred to a vacuum dessicator where they were stored until use.

The purpose of these functional groups introduced by silanation chemistry is to, bind to the organometallic compound prior to reduction and to impart control of cluster size during reduction either in the presence of the supercritical fluid or after extraction and depressurization.

Platinum Seed Layer Deposition and Extraction: Under a $N_2$ atmosphere, wafers are loaded into a 20 ml high pressure reactor along with 7 mg Dimethylcyclo-octadiene Platinum (II) and the vessel is sealed before removal from the inert atmosphere. The reactor is pressurized to 2000 psi with $CO_2$ at 40° C. and remains closed for 60 minutes. The wafers in the reactor are then extracted with 60.0 ml of $CO_2$ over ~2 hours at a flow rate between 0.30 and 0.80 ml/minute. $H_2$ is injected into the reactor via a pressure drop from 3000 to 2600 psi on a 3.8 ml high-pressure manifold over roughly 1.5 minutes. Substrates in the vessel are allowed to soak for an additional 60 minutes prior to depressurization through an activated charcoal filter. Substrates are transferred directly from the reactor vessel to a vacuum dessicator for storage until use.

Electroless Copper Bath Preparation and Copper Deposition: The same bath as used in Example 11 is used here. The electroless copper bath is prepared on a 400 ml total bath volume scale according to the manufacturer's instructions and as follows. 325.5 ml of R.O. $H_2O$ is added to a 250 ml Pyrex recrystallizing dish. The water is stirred with a magnetic TEFLON® stir bar and continuously sparged with $N_2$ through a 1 μM pore size fritted glass filter. The water is heated to 35° C.±~2.0° C. with a heating mantle prior to addition of other bath constituents. Bath components are added in the following sequence with rapid agitation and $N_2$ sparging:

| Bath Component | Volume |
| --- | --- |
| Solution B - EDTA Complex | 40 ml |
| Solution A - CuSO4(aq) [300 g/L] | 16 ml |
| Solution D (provided by manufacturer) | 12 ml |
| Solution G (provided by manufacturer) | 0.8 ml |
| 37% Formaldehyde | 2.0 ml |

Platinum seeded substrates functionalized with 3,3,3-trifluoropropyl-trichlorosilane and 4-[2-(trichlorosilyl)ethyl] pyridine or other silane coupling agents in the manner outlined above can be examined using a JEOL 6320 field emission SEM at 5 kV accelerating voltage.

13. Copper Deposition Onto a Palladium Seeded Silicon Wafer

A thin copper film was deposited onto a palladium seeded silicon wafer in a cold wall reactor using Cu(II) bishexafluoroacetylacetonate $(Cu(hfac)_2)$ at substrate temperatures of 200° C. The Pd was seeded onto the Si wafer by CFD as described above; however, any known standard techniques of applying a seed layer, such as sputtering, can be used.

First, the $Cu(hfac)_2$ precursor was dissolved into supercritical $CO_2$ at 60° C. and 124 bar. The concentration of the precursor was 0.6% by weight. The reaction vessel was allowed to equilibrate for 1 hour at 60° C. and 124 bar. The substrate was then heated to the desired temperature, 200° C. The final pressure was 193 bar. Hydrogen (93 fold molar excess) was then added to the mixture. After three hours, the vessel was cleaned via a $CO_2$ extraction to remove by-products, drained, and the substrate removed. The resulting film was a highly reflective copper colored film.

Figure 8A:
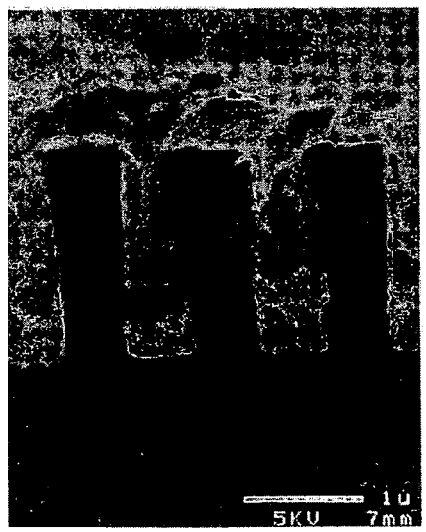
FIG. 8A is a SEM micrograph of a copper film deposited via reduction of copper (II) bishexafluoroacetylacetonate (Cu(hfac)$_2$) onto a palladium seeded silicon wafer.
Figure 8B:
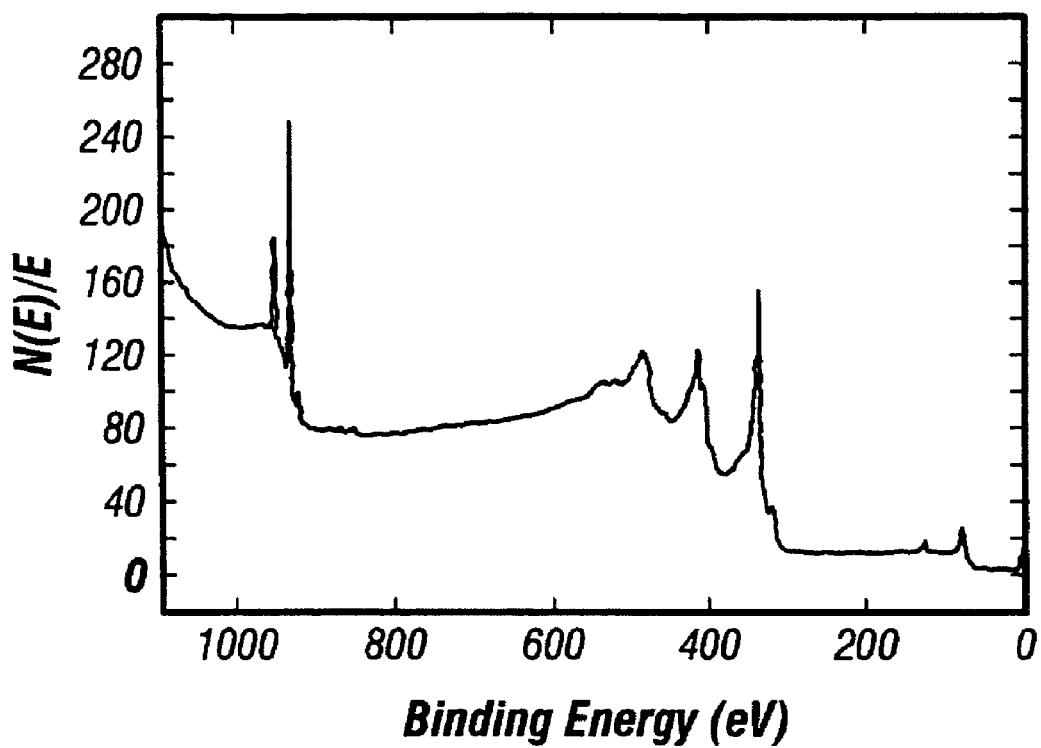
FIG. 8B is an XPS survey spectrum of the copper film of FIG. 8A. Results are shown after sputter cleaning with $Ar^+$ ions to remove atmospheric contamination.

An SEM of the cross-section of the film deposited is shown in FIG. 8A. The SEM shows conformal coverage and uniform filling of deep trenches. An XPS survey spectrum of the film is shown in FIG. 8B. The spectrum shows binding energies characteristic of copper. The copper is substantially free of carbon as evidenced by the carbon Is binding energy at about 284 eV. The density of the $CO_2$ near the substrate surface at 200° C. and 193 bar is known to be about 0.25 g/ml. The bulk temperature of the fluid is lower such that the bulk density of the fluid was approximately 0.47 g/ml based on the initial $CO_2$ loading of the vessel.

Under identical conditions, no deposition took place on an unseeded silicon wafer. Also, no deposition took place in the absence of hydrogen. In addition, flourine NMR revealed that the only by-products of the reaction were 2,4-hexafluouropentanedione and trace residual precursor.

14. Copper Deposition Onto a Palladium Seeded Silicon Wafer

A thin copper film was deposited onto a Pd seeded Si wafer wafer in a cold wall reactor using Cu(I) (hexafluouroacetylacetonate)(2-butyne) at substrate temperatures between 175° C. and 200° C. As in Example 13, the Pd was seeded onto the wafer by CFD as described above.

Figure 9A:
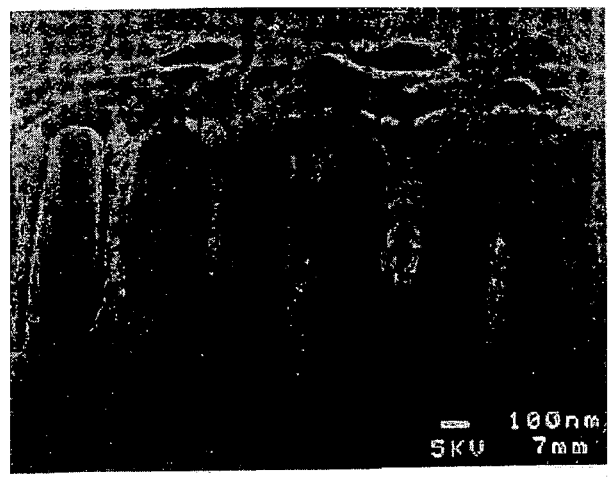
FIG. 9A is a SEM micrograph of a copper film deposited via reduction of copper (I) (hexafluouroacetylacetonate)(2-butyne) (Cu(hfac)(2-butyne)) onto a palladium seeded silicon wafer.
Figure 9B:
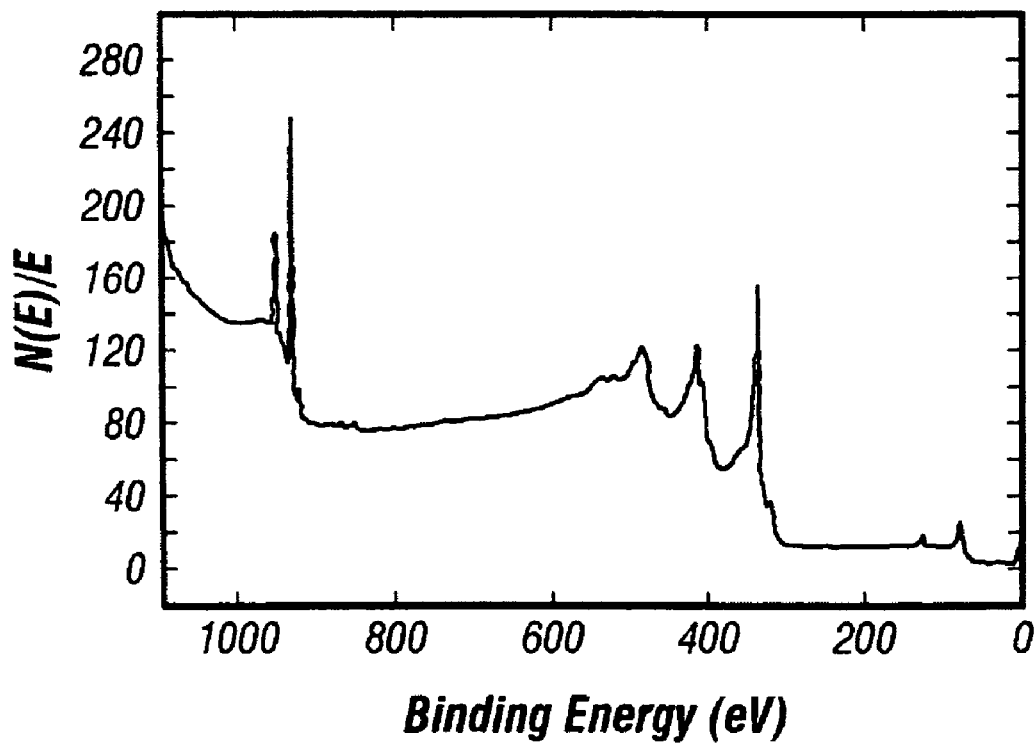
FIG. 9B is an XPS survey spectrum of the copper film of FIG. 9A. Results are shown after sputter cleaning with $Ar^+$ ions to remove atmospheric contamination.

The precursor was dissolved in supercritical $CO_2$ at 60° C. and allowed to equilibrate for 1 hour before the substrate was heated to 200° C. Hydrogen (33 fold molar excess) was then added to the mixture. The concentration of the precursor was 0.6% by weight. The final pressure of the cold wall reactor vessel was 200 bar. The result of the deposition was a highly reflective copper film. An SEM of the cross-section of the film is shown in FIG. 9A. This SEM shows complete filling of narrow trenches with copper metal. FIG. 9B shows an XPS survey spectrum of the copper film. The spectrum shows the binding energies characteristic of copper. The copper is substantially free of carbon as evidenced by the carbon 1s binding energy at about 284 eV. The density of the carbon dioxide near the substrate surface at 200° C. and 200 bar is known to be 0.26 g/ml. The bulk temperature of the fluid is lower such that the bulk density of the fluid was approximately 0.47 g/ml.

Under these conditions, little to no deposition took place on an unseeded silicon wafer. In the absence of hydrogen, light deposition took place on seeded or metallic surfaces. However, the addition of hydrogen greatly increased the amount of deposited copper metal on the substrate. This is important because it indicates a higher yield of the copper being deposited, suggesting that reduction of the Cu(II) reaction product has occurred.

15. Copper Deposition Onto a Unseeded Silicon Wafer

A thin copper film was deposited using Cu(I) (hexafluoroacetylacetonate) (2-butyne) at substrate temperatures above 225° C. in a cold-wall reactor. The precursor was dissolved in supercritical carbon dioxide at 60° C. and allowed to equilibrate for 1 hour before the substrate was heated to 225° C. Hydrogen (49 fold excess) was then added to the mixture. The concentration of the precursor was 0.48% by weight. The hydrogen/precursor ratio was 48.82. The final pressure of the vessel was 200 bar. The result of the deposition was a highly reflective copper film. The density of the carbon dioxide near the substrate surface at 225° C. and 200 bar was 0.23 g/ml. The bulk temperature of the fluid is lower such that the bulk density of the fluid was approximately 0.47 g/ml.

At temperatures below 200° C., as in Example 14, no deposition took place on unseeded surfaces. However, at a temperature of 225° C., deposition occurred on all surfaces, seeded, unseeded, metallic, or polymers such as Kapton® polyimide. This indicates that at a temperature between about 200° C. and 225° C., and certainly at or above 225° C., the deposition becomes non-selective and a seed layer is no longer required.

In the absence of hydrogen, light deposition of copper occurred. However, the addition of hydrogen greatly increased the amount of metal deposited, which indicates an increase in efficiency as described above.

16. Nickel Deposition Onto Glass and Silicon Substrates

Ni was deposited from $CO_2$ solution using bis(cyclopentadienyl)nickel $(NiCp_2)$ as the metal precursor. In the absence of a catalytic surface, $NiCp_2$ is relatively stable in $CO_2$ solution at 200 bar and 60° C. upon the addition of hydrogen, but the reduction proceeds readily at the same conditions over Ni, Pd, or Pt films. Over nickel, the reaction yields two equivalents of cyclopentane and one equivalent of Ni metal, which is incorporated into, and expands, the incipient metal deposit. Plating on non-catalytic surfaces such as polymers was accomplished by seeding the deposition using two strategies. In one embodiment, co-solutions of $NiCp_2$ and an easily reduced organopalladium compound such as 2-methylallyl(cyclopentadienyl)palladium(II) $[CpPd(C4H7)]$ were prepared in stoichiometric ratios ranging from 0.005:1 to 0.1:1 (Pd:Ni). For example, films were co-deposited from a $CO_2$ solution of $NiCp_2$ (0.2 wt. %) at 60° C. and 140 bar and $CpPd(C_4H_7)$ (0.02 wt. %) onto glass. XPS analysis revealed Ni peaks at their appropriate binding energies and insignificant levels of carbon contamination.

In co-reductions with $NiCp_2$, rapid hydrogenolysis of $CpPd(C_4H_7)$ yields catalytic clusters that serve as nucleation sites for the reduction of $NiCp_2$. Once the incipient metal surface is formed, growth of the Ni film proceeds readily.

This was confirmed by composition analysis using x-ray photoelectron spectroscopy (XPS) depth profiling.

The second embodiment involves activation of the substrate by the deposition of an initial seed layer of palladium clusters using CFD. This approach confines the subsequent deposition of pure nickel to the Pd-activated surfaces only, and thus affords opportunities for selective film growth through control of the spatial distribution of the seed layer. Ni films prepared by hydrogen reduction of 0.2% solutions of $NiCp_2$ in $CO_2$ at 140 bar and 60° C. The metal coatings are reflective, continuous, and free of contamination as determined by XPS.

Figure 10A:
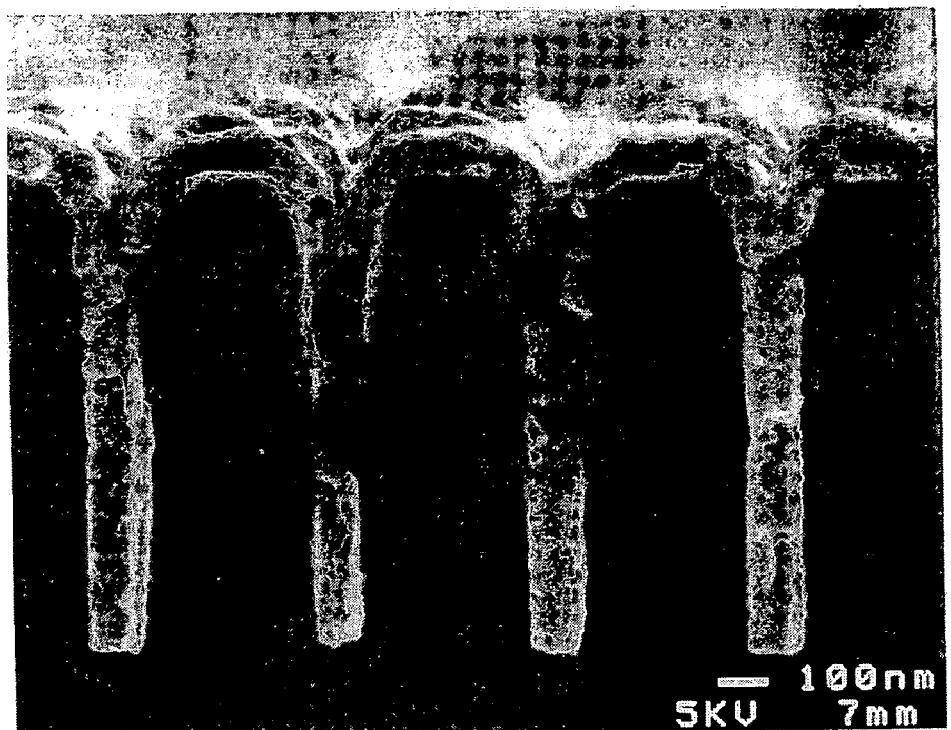
FIGS. 10A to 10D are SEM micrographs of Ni films deposited onto etched Si wafers using a batch reactor at 140 bar and 60° C. (10A and B) or a continuous-flow reactor at 60° C. and 180 bar (10C and D).
Figure 10B:
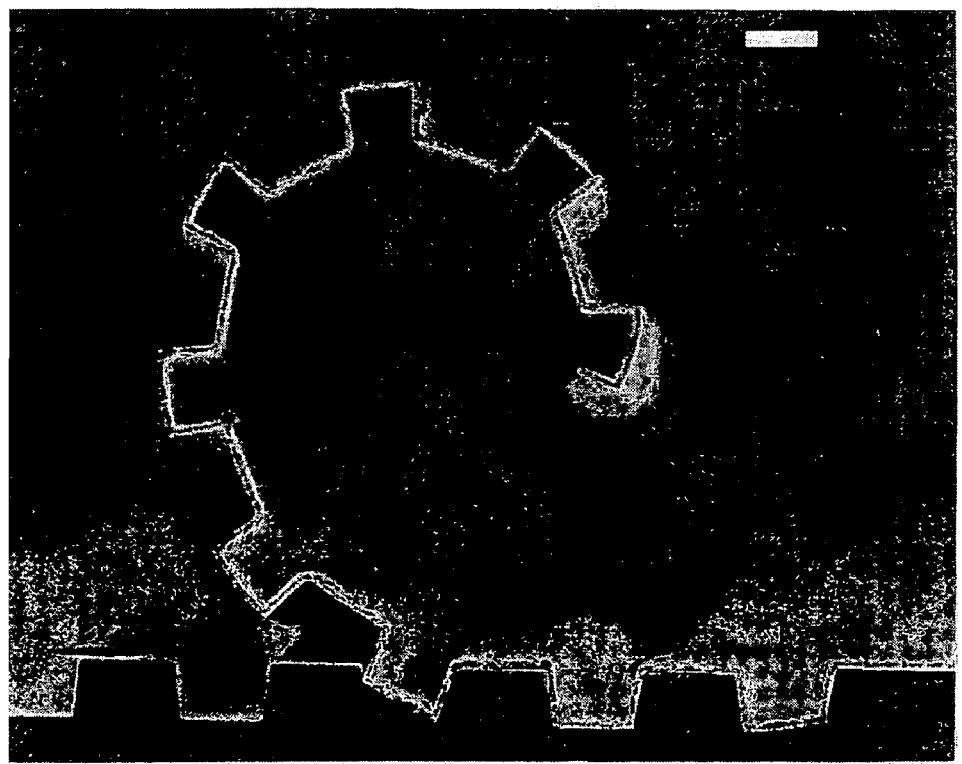

Deposition of Ni onto patterned Si wafers reveals that the high reagent concentrations and favorable fluid-phase transport properties inherent to CFD facilitate conformal deposition. FIGS. 10A to D show SEM micrographs of films deposited within trenches of etched silicon wafers from solutions of $NiCp_2$ using either a batch or a continuous-feed deposition process. A batch process was used to completely fill trenches as narrow as 83 nm with aspect ratios of greater than 10 (FIG. 10A). The uniform filling of the features implies excellent conformality of the Pd seed layer within these deep trenches. Faithful reproduction of the wafer topology and Ni film continuity and cohesion are evident in FIG. 10B, which shows a 100 nm thick Ni film that has delaminated and separated from the etched Si substrate containing micron-wide trenches during the fracturing process employed for sample preparation.

Figure 10C:
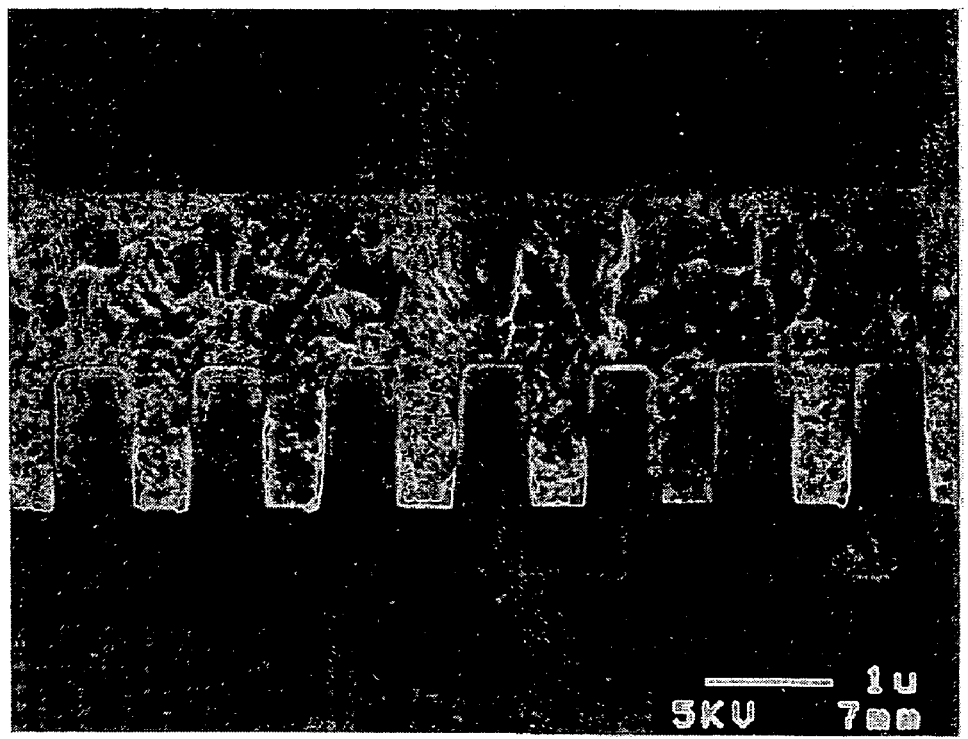
Figure 10D:
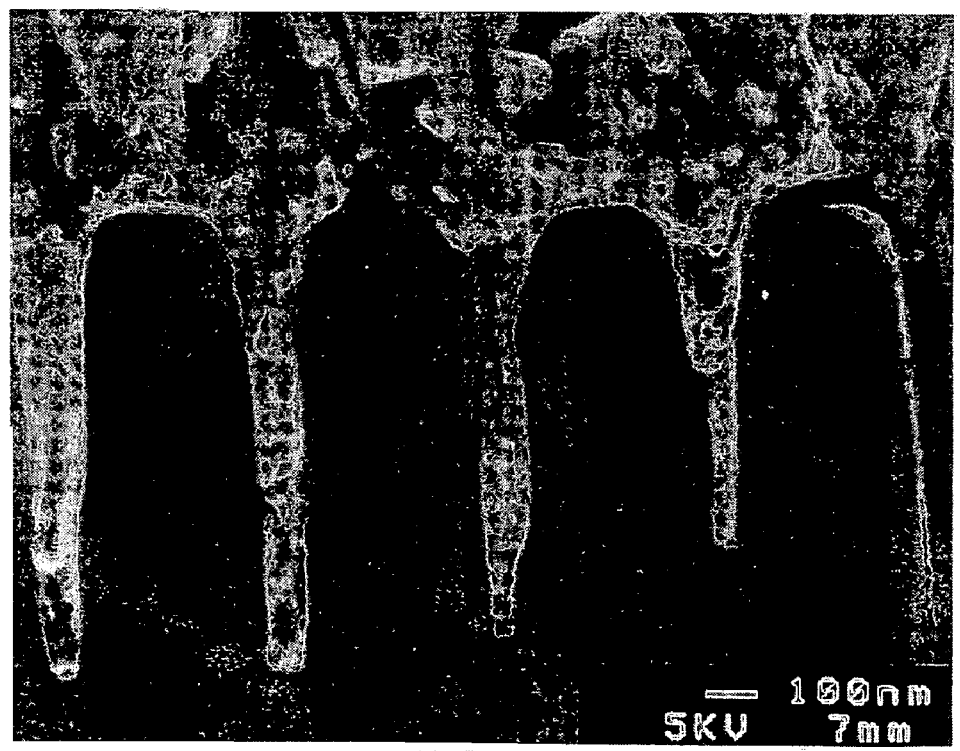

In the batch process (FIGS. 10A and B), film thickness is dictated by the initial precursor loading (0.2 wt. %). The deposited films can be grown to virtually any thickness using a flow reactor in which the reactants are continuously fed to the deposition chamber and the by-products removed via an effluent stream. FIG. 10C shows a seamless, 2.5 micron-thick film deposited in a continuous-flow reactor at 60° C. and 180 bar completely filling 450 nm-wide trenches in the Si wafer. FIG. 10D shows a Ni film grown in the flow reactor on a substrate containing 75 nm trenches. In this example, two of the trenches were not etched completely during fabrication of the test wafer, leaving features as narrow as 45 nm (far right), which are filled upon Ni deposition.

OTHER EMBODIMENTS

It is to be understood that while the invention has been described in conjunction with the detailed description thereof, the foregoing description is intended to illustrate and not limit the scope of the invention, which is defined by the scope of the appended claims.

Other aspects, advantages, and modifications are within the scope of the following claims.

What is claimed is:

1. A method for depositing a film of a material onto the surface of a patterned substrate, the method comprising:
   i) dissolving a precursor of the material into a solvent to form a supercritical or near-supercritical solution, wherein the material comprises multiple metals and the precursor comprises multiple precursors for the multiple metals;
   ii) exposing the patterned substrate to the solution under conditions at which the precursor is stable in the solution; and
   iii) mixing a reaction reagent into the solution under conditions that initiate a chemical reaction involving the precursor, wherein the material is deposited onto the surface of the patterned substrate when the substrate and the reaction reagent are in contact with the solution, while maintaining supercritical or near-supercritical conditions.

2. The method of claim 1, wherein the material is a homogeneous mixture of the multiple metals.

3. The method of claim 2, wherein the material is a platinum/nickel alloy.

4. A film produced by the method of claim 1.

5. An integrated circuit comprising the film of claim 4.

6. A method for depositing an alloy within a microporous or nanoporous solid substrate, the method comprising:
   i) dissolving a precursor of the alloy into a solvent under supercritical or near-supercritical conditions to form a supercritical or near-supercritical solution;
   ii) exposing the solid substrate to the solution under conditions at which the precursor is stable in the solution; and
   iii) mixing a reaction reagent into the solution under conditions that initiate a chemical reaction involving the precursor, thereby depositing the alloy within the solid substrate, while maintaining supercritical or near-supercritical conditions.

7. A method of claim 6, wherein the temperature of the solid substrate is maintained at no more than 300° C.

8. A microporous or nanoporous solid substrate having an alloy deposited within it, wherein the alloy is deposited by the method of claim 6.

9. A method of depositing a seed layer of a material onto a substrate, the method comprising
   i) dissolving a precursor of the material into a solvent to form a supercritical or near-supercritical solution;
   ii) exposing the substrate to the solution under conditions at which the precursor is stable in the solution; and
   iii) mixing a reaction reagent into the solution under conditions that initiate a chemical reaction involving the precursor, wherein the material is deposited as a seed layer onto the surface of the substrate when the substrate and the reaction reagent are in contact with the solution, while maintaining supercritical or near-supercritical conditions.

10. The method of claim 9, wherein the seed layer is discontinuous.

11. The method of claim 9, wherein the seed layer comprises clusters of platinum, palladium, or copper.

12. The method of claim 9, further comprising depositing a metal film on the seed layer.

13. The method of claim 12, wherein the metal film is deposited onto the seed layer by electroless or electrolytic plating.

14. The method of claim 12, wherein the metal film is deposited onto the seed layer by
   i) dissolving a precursor of the metal film into a solvent to form a supercritical or near-supercritical solution;
   ii) exposing the substrate and seed layer to the solution under conditions at which the precursor is stable in the solution; and
   iii) mixing a reaction reagent into the solution under conditions that initiate a chemical reaction involving the precursor, wherein the metal film is deposited onto the seed layer on the surface of the substrate when the substrate and the reaction reagent are in contact with the solution, while maintaining supercritical or near-supercritical conditions, wherein the metal film and the seed layer are of the same or a different material.

15. A method of depositing a material onto a substrate, the method comprising
  i) depositing a seed layer onto the substrate;
  ii) dissolving a precursor of the material into a solvent to form a supercritical or near-supercritical solution;
  iii) exposing the substrate and seed layer to the solution under conditions at which the precursor is stable in the solution; and
  iv) mixing a reaction reagent into the solution under conditions that initiate a chemical reaction involving the precursor, wherein the material is deposited onto the seed layer on the surface of the substrate when the substrate and the reaction reagent are in contact with the solution, while maintaining supercritical or near-supercritical conditions.

16. The method of claim 15, wherein the seed layer is deposited by a reduction reaction.

17. The method of claim 15, wherein the seed layer is deposited by disproportionation.

18. The method of claim 15, wherein the seed layer and the material comprise the same substance.

19. The method of claim 15, wherein the seed layer and the material comprise different substances.

20. A method of depositing a material onto a substrate, the method comprising
  i) dissolving a precursor of the material into a solvent to form a supercritical or near-supercritical solution;
  ii) depositing a seed layer from the precursor by reduction of the precursor; and
  iii) mixing a reaction reagent into the solution under conditions that initiate a chemical reaction involving the precursor or reduction or decomposition products of the precursor, wherein the material is deposited onto the seed layer on the surface of the substrate when the substrate and the reaction reagent are in contact with the solution, while maintaining supercritical or near-supercritical conditions.

21. The method of claim 20, wherein the seed layer is deposited by thermal disproportionation of the precursor.

22. The method of claim 20, wherein the seed layer is deposited by thermolysis of the precursor.

23. The method of claim 20, wherein the seed layer is deposited by oxidation of the precursor.

24. The method of claim 20, wherein the precursor is a Cu(I) compound.

25. The method of claim 20, wherein the precursor is a (beta-diketonate)$CuL_n$, wherein L is a Lewis base, and n 1 or 2.

26. The method of claim 24, wherein the Cu(I) decomposition products comprise Cu(II) compounds.

27. The method of claim 24, wherein the Cu(I) decomposition products comprise Cu(II) (beta-diketonate)$_2$.

28. The method of claim 20, wherein the deposition reaction is a reduction of Cu(I) decomposition products.

29. The method of claim 20, wherein the reaction reagent is $H_2$.

30. The method of claim 20, wherein the deposition of the seed layer and the introduction of the reaction reagent is performed simultaneously.

31. The method of claim 20, wherein the deposition of the seed layer and the introduction of the reaction reagent is performed sequentially.

32. A method of depositing a material onto a substrate, the method comprising
  i) dissolving a precursor of the material into a solvent to form a supercritical or near-supercritical solution; and
  ii) depositing the material by simultaneous thermal reduction and reaction with a reaction reagent in the solution under conditions that initiate a chemical reaction involving the precursor or reduction or decomposition products of the precursor, wherein the material is deposited on the surface of the substrate when the substrate and the reaction reagent are in contact with the solution, while maintaining supercritical or near-supercritical conditions.

33. The method of claim 32, wherein the material deposited is copper.

34. The method of claim 32, wherein the precursor is a Cu(I) compound.

35. A method of depositing a material onto a substrate, the method comprising
  i) dissolving a precursor or mixture of precursors of the material into a solvent to form a supercritical or near-supercritical solution; and
  ii) adding a reaction reagent in the solution under conditions that initiate a chemical reaction involving the precursor or reduction or decomposition products of the precursor, wherein the material is deposited on the surface of the substrate when the substrate and the reaction reagent are in contact with the solution, while maintaining supercritical or near-supercritical conditions.

36. The method of claim 35, wherein the material deposited is copper.

37. The method of claim 35, wherein the precursor is a Cu(I) compound.

38. The method of claim 35, wherein the precursors are a mixture of Cu(I) compounds.

39. The method of claim 35, wherein the precursors are a mixture of Cu(I) and Cu(II) compounds.

40. The method of claim 35, wherein the mixture of precursors is selected from the group consisting of (beta-diketonate)$CuL_n$ compounds, where L is a Lewis base and n 1 or 2, and Cu(II) (beta-diketonate)$_2$ compounds.

41. The method of claim 35, wherein the deposition is nonselective.

42. The method of claim 35, wherein the deposition is selective.

43. A film produced by a method for depositing a film of a material onto a surface of a patterned substrate, the method comprising:
  i) dissolving a precursor of the material into a solvent to form a supercritical or near-supercritical solution;
  ii) exposing the patterned substrate to the solution under conditions at which the precursor is stable in the solution; and
  iii) mixing a reaction reagent into the solution under conditions that initiate a chemical reaction involving the precursor, wherein the material is deposited onto the surface of the patterned substrate when the substrate and the reaction reagent are in contact with the solution, while maintaining supercritical or near-supercritical conditions.

44. An integrated circuit comprising the film of claim 43.

* * * * *

UNITED STATES PATENT AND TRADEMARK OFFICE
CERTIFICATE OF CORRECTION

| | | |
|---|---|---|
| PATENT NO. | : 6,992,018 B2 | Page 1 of 1 |
| APPLICATION NO. | : 10/745843 | |
| DATED | : January 31, 2006 | |
| INVENTOR(S) | : James J. Watkins et al. | |

It is certified that error appears in the above-identified patent and that said Letters Patent is hereby corrected as shown below:

In the Specification

Column 1, line 17, insert the following paragraph

-- GOVERNMENT SUPPORT

The invention was made with government support under NSF #CTS-9734177. The government has certain rights in this invention. --

Signed and Sealed this
Second Day of December, 2014

Michelle K. Lee
*Deputy Director of the United States Patent and Trademark Office*